United States Patent
Utsugi et al.

[19]

[11] Patent Number: 5,858,562
[45] Date of Patent: Jan. 12, 1999

[54] ORGANIC THIN FILM ELECTROLUMINESCENT DEVICE

[75] Inventors: Koji Utsugi; Akira Hirano; Eriko Tsuruoka; Naoyasu Ikeda, all of Tokyo, Japan

[73] Assignee: NEC Corporation, Tokyo, Japan

[21] Appl. No.: 542,624

[22] Filed: Oct. 13, 1995

[30] Foreign Application Priority Data

Oct. 13, 1994 [JP] Japan ................................. 6-247930

[51] Int. Cl.$^6$ .................................................. H05B 33/14
[52] U.S. Cl. ..................... 428/690; 428/704; 428/917; 428/332; 428/411.1; 428/457; 313/504; 313/506
[58] Field of Search ..................... 313/504, 506; 428/690, 704, 917, 332, 411.1, 457; 564/426, 431, 433, 434

[56] References Cited

U.S. PATENT DOCUMENTS

| | | | |
|---|---|---|---|
| 5,338,634 | 8/1994 | Ueda | 430/59 |
| 5,443,922 | 8/1995 | Nishizaki et al. | 428/690 |
| 5,536,949 | 7/1996 | Hosokawa et al. | 257/40 |

FOREIGN PATENT DOCUMENTS 5-239455  9/1993  Japan .

*Primary Examiner*—Marie Yamnitzky
*Attorney, Agent, or Firm*—Young & Thompson

[57] ABSTRACT

A hole transport layer in an organic electroluminescent device is made of a material containing at least a ditriphenylaminestyryl derivative expressed by the general formula:

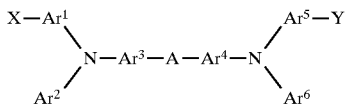

where A is selected from the group consisting of substituted and non-substituted alkylidene groups, cycloalkylidene groups, oxygen atom, sulfur atom, amino groups; where $Ar^1$, $Ar^3$, $Ar^4$ and $Ar^5$ are selected from the group consisting of substituted and non-substituted arylene groups; where $Ar^2$ and $Ar^6$ are one selected from the group consisting of substituted aryl groups and non-substituted aryl groups; and where X and Y are substituted groups expressed by the formula:

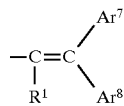

where $Ar^7$ and $Ar^8$ are selected from the group consisting of substituted aryl groups and non-substituted aryl groups; and where $R^1$ is one selected from the group consisting of hydrogen atom, halogen atom, hydroxyl groups, substituted and non-substituted amino groups, substituted and non-substituted alkoxy groups, substituted and non-substituted alkyl groups having 1–6 carbon atoms.

48 Claims, 8 Drawing Sheets

ORGANIC THIN FILM ELECTROLUMINESCENT DEVICE

BACKGROUND OF THE INVENTION

The present invention relates to an organic thin film electro-luminescence device and an organic thin film electro-luminescence device having pixels arranged in a matrix.

The organic thin film electro-luminescence device has an anode, a cathode and a light emission layer. Holes are supplied from the anode and injected into the light emission layer. Electrons are supplied from the cathode and injected into the light emission layer. As a result, there appears, in the light emission layer, recombinations of the injected electrons and holes. The recombinations of the electrons and holes cause energy-excited states which results in light emissions. The energy-excited states are dependent upon the materials contained in the light emission layer. The organic thin film electro-luminescence device is designed so that an organic light emission layer, showing a strong luminance, is sandwiched between the anode and the cathode. However, depending upon the material constituting the light emission layer, various design modifications of the material constituting the hole transport layer of the organic thin film electroluminescent device are required to obtain optimal luminance efficiency, durability and driving stability. It has been disclosed in the prior art that the organic thin film electroluminescent device, having a hole transport layer and an electron transport layer, is effective in improving luminance efficiency and a driving stability. Further more, doping of guest molecules into the organic emission layer is also effective to improve luminance efficiency and driving stability. In Applied Physics Letters, Vol. 51(12), 21 Sep. 1987, Tang and VanSlyke reported that an organic thin film electroluminescent device exhibited a luminance of over 1000 $cd/m^2$ and a maximum luminance efficiency of 1.51 m/W at a driving voltage of less than 10 V. Tang and VanSlyke teach that it is possible to develop an organic thin film electroluminescent device that is driven to high brightness at a low voltage, and that the efficiency of the device is dependent upon both the materials and structural features. Namely, it is important that the light emission layer is made of tris(8-hydroxyquinolinolate)aluminum, and further that the hole transport layer placed between the anode and the light emission layer is made of derivatives of triphenyldiamine. The hole transport layer of the derivatives of triphenyldiamine improves the efficiency of the injection of holes into the light emission layer and also determines the probability of the injections of electrons into the light emission layer. As a result, the efficiency in the generation of excitons in the light emission layer is improved. The hole transport layer of the derivatives of triphenyldiamine contributes to confine the generated excitons in the light emission layer.

The improvement of the hole transport layer may not only provide an improvement in the luminance efficiency but may also ensure the driving stability of the above device. It has been proposed that double hole transport layers provide a significant improvement in durability. In this regard, the U.S. Pat. No. 4,720,432 discloses the following. A hole injection layer of a porphyrin system is provided on the anode. A hole transport layer made of derivatives of triphenyldiamine is provided on the hole injection layer. The organic thin film electroluminescience device, having those structures, exhibited a continuous luminance for about 500 hours at an injection current of 5 $mA/cm^2$ at a voltage of 7.2 V. In the other device without the above structural modifications, the driving voltage is generally around 6V.

In Applied Physics Letters, Vol. 65, p. 807, 1994, Shirota et al. reported as follows. There are provided two hole transport layers. The first hole transport layer, in contact with the anode, is made of -conjugated starburst molecule, 4,4',4'-tris(3-methylphenyl-phenylamino)triphenylamine. The second hole transport layer, in contact with the light emission layer, is made of N,N'-diphenyl-N,N'bis(3-methylphenyl)-[1,1'-biphenyl]-4,4'-diamine. The combination of those materials may cause the light emission layer of tris(8-hydroxyquinolinolate)aluminum to exhibit a high luminance efficiency. It was confirmed that an initial luminance is 300 $cd/m^2$ and a half-value period is 300 hours at the constant current driving. The second hole transport layer of N,N'-diphenyl-N,N'bis(3-methylphenyl)-[1,1'-biphenyl]-4,4'-diamine, provided between the hole transport layer of the -conjugated starburst molecule and the light emission layer, forms a gentle slope barrier, that holes will experience in the injection into the light emission layer. The gentle slop barrier improves the efficiency of the injection of holes into the light emission layer, which, in turn, improves luminance efficiency. In summary, the hole transport layer made of -conjugated starburst molecule, 4,4',4'-tris(3-methylphenyl-pheny-lamino)triphenylamine contributes to driving stability. The second hole transport layer made of N,N'-diphenyl-N,N'bis(3-methylphenyl)-[1,1'-biphenyl]-4,4'-diamine may contribute rising the efficiency of hole injection, or the efficiency of the luminance.

In Polymer Preprints Japan, Vol. 42, p. 615, 1993, Ito et al. report other electroluminescent device as follows. First and second hole transport layers are in turn provided on an indium-tin-oxide substrate. The first hole transport layer is made of a lyphosphazenpolymer, having as side chains copper phthalocyanine and triphenylamine. The second hole transport layer is made of N,N'-diphenyl-N,N'bis(3-methylphenyl)-[1,1'-biphenyl]-4,4'-diamine. A light emission layer is provided on the second hole transport layer, wherein the light emission layer is made of tris(8-hydroxyquinolinolate)aluminum doped with quinacridone. After this device was placed in a room for two months, it was continuously driven by a constant current. The device exhibited an initial luminance of 587 $cd/m^2$ and a half-value period of 166 hours.

In order to develop the organic thin film electroluminescent device, it is important not only to improve the materials for the device, but also to improve the structure of the device. One of the important issues of the device, to be solved by the development, is how to realize a multiple color display with a possible low cost.

One of the organic thin film electroluminescent devices having high fine matrix type display is disclosed in the Japanese laid-open patent application No. 5-253866. The disclosed organic thin film electroluminescent device has a driving circuit, which includes novel thin films transistors serving as switches. This device may suppress the deterioration in the degree of the luminance, caused by a high duty ratio of pulses for driving the device. This means that the organic thin film electroluminescent device, having an increased number of the pixels, may be driven without the deterioration of the degree of luminance.

As described above, the development of the organic thin film electroluminescent device spreads over the improvements of the materials, the structure and the driving performance.

The organic thin film electroluminescent devices described above are designed to be continuously driven by the constant currents. This causes the following problems.

First one is a relatively large reduction in intensity of the luminance after a long time passes, thereby the voltage level necessary for the luminance is increased and the luminance efficiency is dropped. As the long time passes, there becomes apparent a variation in intensity of the luminance of the device. One of the cuses of those undesirable phenomenon's is in a crystallization of the material constituting the hole transport layer of the device. The crystallization is caused by heat generated in driving the device. The crystallization is also caused by having a long time pass. The crystallization causes electric field to be applied but not uniformly on the layers between the anode and the cathode. This results in a difficulty in achieving the uniform luminances of individual pixels of the device.

From the above description, it can been seen that, in order to settle the above problems, it is necessary to prevent the crystallization of the material constituting the hole transport layer of the device. It has been proposed by Tsuruoka et al. that a bis-triphenylaminestyryl compound is used as a material of the hole transport layer of the organic thin film electroluminescent device because the bis-triphenylaminestyryl compound possesses a high hole mobility and a high glass-transition temperature. The glass-transition temperature is defined as a temperature, over which the crystallization appears. The high glass-transition temperature may prevent the crystallization, due to the heat generation, of the material constituting the hole transport layer. The high hole mobility is one important factor for causing a high efficiency of injection of holes into the light emission layer. These are reported by Tsuruoka et al. in Japan Chemical Society, 1994. The hole transport layer is so provided as to be in contact with the anode. The emission layer is provided between the hole transport layer and the cathode. This device, when driven at the constant current, exhibits the luminance, characterized by almost the same half-value period as the well known device, having the hole transport layer made of N,N'-diphenyl-N,N'bis(3-methylphenyl)-[1,1'-biphenyl]-4,4'-diamine. The above device reported by Turuoka et al. exhibits the luminance at a half intensity, per a unit current-density, of the luminance intensity of the above well known device. The cause of the small intensity of luminance per a unit current-density is in the facts that excitons generated in the light emission layer are quenched but not blocked by the hole transport layer, and that some of the electrons injected in the light emission layer tend to move to the anode side without exhibiting the recombination with holes in the light emission layer.

Accordingly, it would be important for the organic thin film electroluminescent device to ensure a high efficiency of transport of holes in the hole transport layer. It is also important to ensure a high efficiency of injections of holes into the light emission layer. It is further important to secure a sufficiently high degree of confinement, in the light emission layer, of the excitons, generated in the emission layer, and electrons. The sufficiently high degree of confinement of the excitons and electrons ensures a high probability of recombination of the holes and electrons in the light emission layer. It is moreover important to select the optimum material for the hole transport layer, in consideration of the preventions of any crystallization of the material due to the heat generated by the driving of the device.

SUMMARY OF THE INVENTION

Accordingly, it is a general object of the present invention to provide a novel organic thin film electroluminescent device, free from any problems or disadvantages described above.

It is a concrete object of the present invention to provide a novel organic thin film electroluminescent device, which ensures a high efficiency of transport of holes in the hole transport layer.

It is a further concrete object of the present invention to provide a novel organic thin film electroluminescent device, which ensures a high efficiency of injections of holes into the light emission layer.

It is a furthermore concrete object of the present invention to provide a novel organic thin film electroluminescent device, which secure a sufficiently high degree of confinement, in the light emission layer, of the excitons, generated in the emission layer and electrons.

It is a moreover concrete object of the present invention to provide a novel organic thin film electroluminescent device, which exhibits a long durability.

The above and other objects, features and advantages of the present invention will be apparent from the following descriptions.

The invention provides a novel hole transport layer provided in an organic electroluminescent device. The hole transport layer is made of a material containing at least a ditriphenylaminestyryl derivative expressed by the general formula:

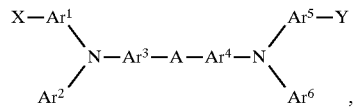

where A is one selected from the group consisting of substituted alkylidene groups having not less than 10 carbon atoms, non-substituted alkylidene groups having not less than 10 carbon atoms, cycloalkylidene groups, oxygen atom, sulfur atom, substituted amino groups and non-substituted amino groups; where $Ar^1$, $Ar^3$, $Ar^4$ and $Ar^5$ are one selected from the group consisting of substituted arylene groups and non-substituted arylene groups; where $Ar^2$ and $Ar^6$ are one selected from the group consisting of substituted aryl groups and non-substituted aryl groups; and where X and Y are substituted groups expressed by the formula:

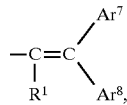

where $Ar^7$ and $Ar^8$ are one selected from the group consisting of substituted aryl groups and non-substituted aryl groups; and where and $R^1$ is one selected from the group consisting of hydrogen atom, halogen atom, hydroxyl groups, substituted amino groups, non-substituted amino groups, substituted alkoxy groups, non-substituted alkoxy groups, substituted alkyl groups having 1–6 carbon atoms and non-substituted alkyl groups having 1–6 carbon atoms.

The present invention also provides an organic thin film electroluminescent device comprising an anode; a hole transport layer in contact with the anode and having a first energy band gap; a potential barrier layer in contact with the hole transport layer and having a second energy band gap which is larger than the first energy band gap; a light emission layer in contact with the potential barrier layer and having a third energy band gap which is smaller than the second energy band gap; and a cathode in contact with the light emission layer. The hole transport layer is made of a material containing at least a ditriphenylaminestyryl derivative expressed by the general formula:

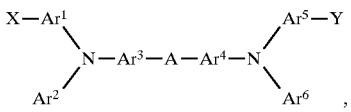

where A is one selected from the group consisting of substituted alkylidene groups having not less than 10 carbon atoms, non-substituted alkylidene groups having not less than 10 carbon atoms, cycloalkylidene groups, oxygen atom, sulfur atom, substituted amino groups and non-substituted amino groups; where $Ar^1$, $Ar^3$, $Ar^4$, and $Ar^5$ are one selected from the group consisting of substituted arylene groups and non-substituted arylene groups; where $Ar^2$, and $Ar^6$ are one selected from the group consisting of substituted aryl groups and non-substituted aryl groups; and where X and Y are substituted groups expressed by the formula:

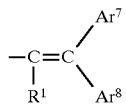

where $Ar^7$ and $Ar^8$ are one selected from the group consisting of substituted aryl groups and non-substituted aryl groups; and where $R^1$ is one selected from the group consisting of hydrogen atom, halogen atom, hydroxyl groups, substituted amino groups, non-substituted amino groups, substituted alkoxy groups, non-substituted alkoxy groups, substituted alkyl groups having 1–6 carbon atoms and non-substituted alkyl groups having 1–6 carbon atoms.

BRIEF DESCRIPTIONS OF THE DRAWINGS

Preferred embodiments of the present invention will be described in detail with reference to the accompanying drawings.

DESCRIPTION OF THE INVENTION

Figure 1:
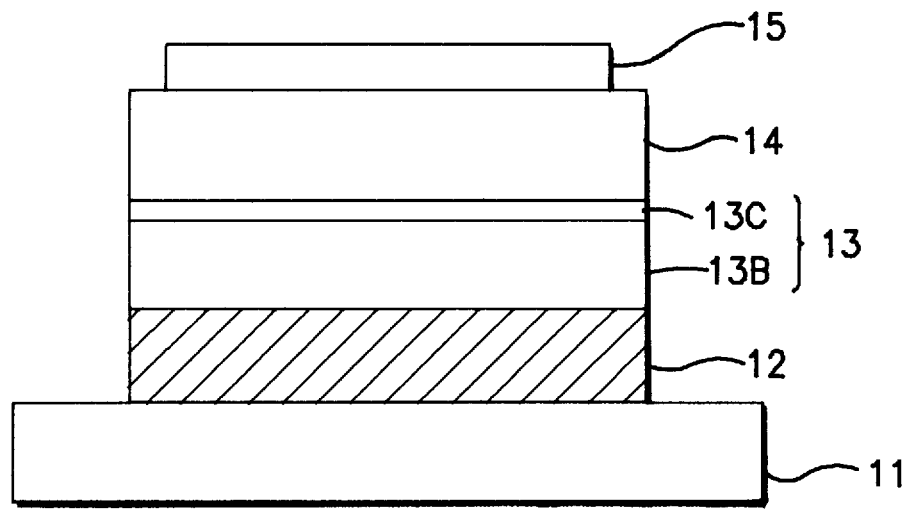
FIG. 1 is a fragmentary cross sectional elevation view illustrative of an organic thin film electroluminescent device in first to twentieth embodiments according present invention.

According to the present invention, there is provided a novel hole transport layer provided in an organic electroluminescent device. The layer is made of a material containing at least a ditriphenylaminestyryl derivative expressed by the general formula

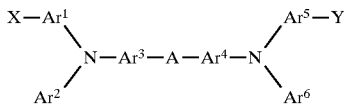

where A is one selected from the group consisting of substituted alkylidene groups having not less than 10 carbon atoms, non-substituted alkylidene groups having not less than 10 carbon atoms, cycloalkylidene groups, oxygen atom, sulfur atom, substituted amino groups and non-substituted amino groups; where $Ar^1$, $Ar^3$, $Ar^4$, and $Ar^5$ are one selected from the group consisting of substituted arylene groups and non-substituted arylene groups; where $Ar^2$, and $Ar^6$ are one selected from the group consisting of substituted aryl groups and non-substituted aryl groups; and where X and Y are substituted groups expressed by the formula:

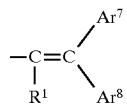

where $Ar^7$, and $Ar^8$ are one selected from the group consisting of substituted aryl groups and non-substituted aryl groups; and where $R^1$ is one selected from the group consisting of hydrogen atom, halogen atom, hydroxyl groups, substituted amino groups, non-substituted amino groups, substituted alkoxy groups, non-substituted alkoxy groups, substituted alkyl groups having 1–6 carbon atoms and non-substituted alkyl groups having 1–6 carbon atoms.

The allyl groups of $Ar^7$ and $Ar^8$ may comprise either phenyl groups or naphthyl groups.

The amino groups of $R^1$ may comprise dimethylamino groups, diethylamino groups or diphenylamino groups.

The alkoxy groups of $R^1$ may comprise methoxy groups, ethoxy groups, propoxy groups or butoxy groups.

The alkyl groups of $R^1$ may comprise either methyl groups, ethyl groups, propyl groups or butyl groups.

The halogen atom of $R^1$ may comprise either fluorine atom, chlorine atom, bromine atom or iodine atom.

The alkylidene groups of A may comprise either methylidene groups, 2,2-propylidene groups or 2-methylpropylidene groups.

The cycloalkylidene groups of A may comprise cyclohexylidene groups or 4-tert-butylcyclohexylidene groups.

The amino groups of A may comprise either methylamino groups, ethylamino groups or phenylamino groups.

The aryl and arylene groups of $Ar^1$, $Ar^2$, $Ar^3$, $Ar^4$, $Ar^5$, and $Ar^6$ may comprise either phenyl, naphthyl, anthryl, phenylene, naphthylene or anthrylene.

The material of the hole transport layer may further include either a triphenyldiamine derivative, an oxadiazole derivative, a porphyrin derivative, a stilbene derivative or an arylamine derivative.

The material of the hole transport layer may be dispersed in polymers such as poly-(N-vinylcarbazole), polycarbonate, polymethylacrylate, polymethylmethacrylate, polystyrene polymer, polysilylene polymer, polythiophene polymer, polyaniline or polyphenylenevinylene.

The present invention also provides an organic thin film electroluminescent device comprising an anode; a hole transport layer in contact with the anode and having a first energy band gap; a potential barrier layer in contact with the hole transport layer and having a second energy band gap which is larger than the first energy band gap; a light emission layer in contact with the potential barrier layer and having a third energy band gap which is smaller than the second energy band gap; and a cathode in contact with the light emission layer.

The hole transport layer is made of a material containing at least a ditriphenylaminestyryl derivative expressed by the general formula:

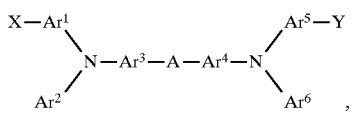

where A is one selected from the group consisting of substituted alkylidene groups having not less than 10 carbon atoms, non-substituted alkylidene groups having not less than 10 carbon atoms, cycloalkylidene groups, oxygen atom, sulfur atom, substituted amino groups and non-substituted amino groups; where $Ar^1$, $Ar^3$, $Ar^4$, and $Ar^5$ are one selected from the group consisting of substituted arylene groups and non-substituted arylene groups; where $Ar^2$, and $Ar^6$ are one selected from the group consisting of substituted aryl groups and non-substituted aryl groups; and where X and Y are substituted groups expressed by the formula:

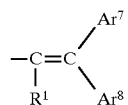

where $Ar^7$ and $Ar^8$ are one selected from the group consisting of substituted aryl groups and non-substituted aryl groups; and where $R^1$ is one selected from the group consisting of hydrogen atom, halogen atom, hydroxyl groups, substituted amino groups, non-substituted amino groups, substituted alkoxy groups, non-substituted alkoxy groups, substituted alkyl groups having 1–6 carbon atoms and non-substituted alkyl groups having 1–6 carbon atoms.

The allyl groups of $Ar^7$ and $Ar^8$ may comprise either phenyl groups or naphthyl groups.

The amino groups of $R^1$ may comprise either dimethylamino groups, diethylamino groups or diphenylamino groups.

The alkoxy groups of $R^1$ may comprise either methoxy groups, ethoxy groups, propoxy groups or butoxy groups.

The alkyl groups of $R^1$ may comprise either methyl groups, ethyl groups, propyl groups or butyl groups.

The halogen atom of $R^1$ may comprise either fluorine atom, chlorine atom, bromine atom or iodine atom.

The alkylidene groups of A may comprise either methylidene groups, 2,2-propylidene groups or 2-methylpropylidene groups.

The cycloalkylidene groups of A may comprise cyclohexylidene groups or 4-tert-butylcyclohexylidene groups.

The amino groups of A may comprise either methylamino groups, ethylamino groups or phenylamino groups.

The aryl and arylene groups of $Ar^1$, $Ar^2$, $Ar^3$, $Ar^4$, $Ar^5$ and $Ar^6$ may comprise either phenyl, naphthyl, anthryl, phenylene, naphthylene or anthrylene.

The material of the hole transport layer may further include either a triphenyldiamine derivative, an oxadiazole derivative, a porphyrin derivative, a stilbene derivative or an arylamine derivative.

The material of the hole transport layer may be dispersed in a medium of any one of polymers such as poly-(N-vinylcarbazole), polycarbonate, polymethylacrylate, polymethylmethacrylate, polystyrene polymer, poly-silylene polymer, polythiophene polymer, polyaniline or polyphenylene-vinylene.

The above described hole transport layer may be formed by any one of the methods which have already been known by a person having ordinary skill in the art, to witch the invention pertains. For example, a vacuum evaporation method, a molecular beam epitaxy method, a dipping method, a spin coating method, a casting method, a bar coat method and a roll coat method are available.

The potential barrier layer is provided between the above hole transport layer and the light emission layer and has a larger energy band gap than an energy band gap of the light emission layer. Thus, the potential barrier layer can perform to contribute to confinements of excitons and electrons within the light emission layers.

It is preferable that the potential barrier layer has a thickness of not more than 10 nanometers.

The potential barrier layer may, for example, comprise any one of triphenyldiamine derivatives, oxadiazole derivatives, hydrazone derivatives, butadiene derivatives, styryl derivatives, pyrazoline derivatives and benzidine derivatives.

The light emission layer may, for example, comprise any one of 8-quinolinol, metal complexes of 8-quinolinol derivatives, tetraphenylbutadiene derivatives, distyrylallyl derivatives, coumarin system derivatives, quinacridone derivatives, perylene system derivatives, polymethine system derivatives, antracene derivatives and polyvinylcarbazole.

It may optionally be available to further provide a hole injection layer between the anode and the hole transport layer in order to ensure a stability of the injection of holes into the light emission layer. It is preferable that the hole injection layer has a thickness of not more than 30 nanometers.

The hole injection layer may preferably comprise a coloring matter of condensed multiring system such as spiro compounds, azo compounds, quinone compounds, indigo compounds, diphenylmethane compounds, quinacridone compounds, polymethyl compounds, acridine compounds and porphyrine compounds.

The hole injection layer may also comprise one of low molecular organic p-type semiconductors, such as aromatic amine, mentioned in ORGANIC SEMICONDUCTORS: VERLAG CHEMIE' 74.

An electron injection layer may be provided between the cathode and the light emission layer in order to ensure a stability of the injection of electrons into the light emission layer.

The electron injection layer may, for example, comprise any one of 8-quinolinol, 8-quinolinol derivatives, oxydiazole derivatives and diphenylquinone derivatives.

The anode may preferably comprise a metal having a work function of not less than 4.5 V such as any one of indium-tin-oxide, tin oxide, gold, silver, platinum and copper.

The cathode may preferably comprise any one of indium, aluminum, magnesium, magnesium-indium alloy, magnesium-aluminum alloy, aluminum-lithium alloy and aluminum-scandium-lithium alloy.

A sealing layer covering the device may be provided in order to protect the device from oxygen and moisture in the atmosphere. The sealing layer may preferably comprise any one of metal oxide, metal sulfide and metal fluoride.

The following Tables 1–26 illustrate chemical structural formulas of the above described individual compounds of A, X, Y, $Ar^1$, $Ar^2$, $Ar^3$, $Ar^4$, $Ar^5$ and $Ar^6$, constituting the hole transport layer of the organic thin film electroluminescent device according to the present invention.

TABLE 1

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 1 | phenyl | 4-methylphenyl | phenyl | phenyl | phenyl | 4-methylphenyl | phenyl | phenyl | H | cyclohexyl |
| 2 | phenyl | 4-methylphenyl | phenyl | phenyl | phenyl | 4-methylphenyl | 4-methylphenyl | 4-methylphenyl | H | cyclohexyl |
| 3 | phenyl | 4-methylphenyl | phenyl | phenyl | phenyl | 4-methylphenyl | 4-methoxyphenyl | 4-methoxyphenyl | H | cyclohexyl |
| 4 | phenyl | 4-methylphenyl | phenyl | phenyl | phenyl | 4-methylphenyl | 3,5-dimethylphenyl | 3,5-dimethylphenyl | H | cyclohexyl |
| 5 | phenyl | 4-methylphenyl | phenyl | phenyl | phenyl | 4-methylphenyl | 4-chlorophenyl | phenyl | H | cyclohexyl |
| 6 | phenyl | 4-methylphenyl | phenyl | phenyl | phenyl | 4-methylphenyl | phenyl | 4-methylphenyl | H | cyclohexyl |

TABLE 2

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 7 | 4-CH₃O-C₆H₄- | 4-CH₃O-C₆H₄- | C₆H₅- | C₆H₅- | C₆H₅- | 4-CH₃O-C₆H₄- | 4-CH₃O-C₆H₄- | C₆H₅- | H | cyclohexyl |
| 8 | 4-CH₃O-C₆H₄- | 4-CH₃O-C₆H₄- | C₆H₅- | C₆H₅- | C₆H₅- | 4-CH₃O-C₆H₄- | 3-CH₃O-C₆H₄- | C₆H₅- | H | cyclohexyl |
| 9 | 4-CH₃O-C₆H₄- | 4-CH₃O-C₆H₄- | C₆H₅- | C₆H₅- | C₆H₅- | 4-CH₃O-C₆H₄- | 4-(C₂H₅)₂N-C₆H₄- | C₆H₅- | H | cyclohexyl |
| 10 | 4-CH₃O-C₆H₄- | 4-CH₃O-C₆H₄- | C₆H₅- | C₆H₅- | C₆H₅- | 4-CH₃O-C₆H₄- | 4-(C₂H₅)₂N-C₆H₄- | 4-(C₂H₅)₂N-C₆H₄- | H | cyclohexyl |
| 11 | 4-CH₃O-C₆H₄- | 4-CH₃O-C₆H₄- | C₆H₅- | C₆H₅- | C₆H₅- | 4-CH₃O-C₆H₄- | 4-C₂H₅-C₆H₄- | 4-C₂H₅-C₆H₄- | H | cyclohexyl |
| 12 | 4-(C₂H₅)₂N-C₆H₄- | 4-(C₂H₅)₂N-C₆H₄- | C₆H₅- | C₆H₅- | C₆H₅- | 4-(C₂H₅)₂N-C₆H₄- | 3-CH₃-C₆H₄- | C₆H₅- | H | cyclohexyl |

TABLE 3

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 13 | phenyl | 4-methylphenyl | phenyl | phenyl | phenyl | 4-methylphenyl | 1-naphthyl | 4-(N,N-diethylamino)phenyl | H | cyclohexyl (H) |
| 14 | phenyl | 4-methylphenyl | phenyl | phenyl | phenyl | 4-methylphenyl | 1-naphthyl | 4-methylphenyl | H | cyclohexyl (H) |
| 15 | phenyl | 4-methylphenyl | phenyl | phenyl | phenyl | 4-methylphenyl | 1-naphthyl | 3-methoxyphenyl | H | cyclohexyl (H) |
| 16 | phenyl | 4-methylphenyl | phenyl | phenyl | phenyl | 4-methylphenyl | 1-naphthyl | 3,5-dimethylphenyl | H | cyclohexyl (H) |

TABLE 3-continued
| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 17 | 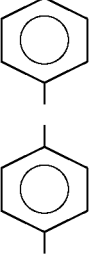 | 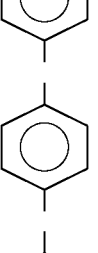 | 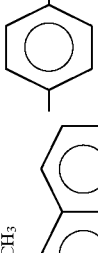 | 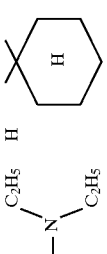 | 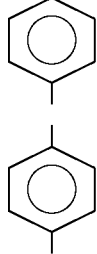 | 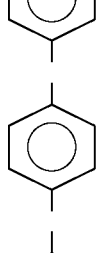 | 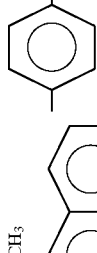 | 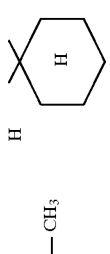 | H |  |
| 18 | 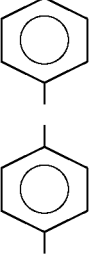 | 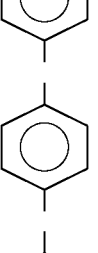 | 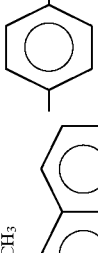 | 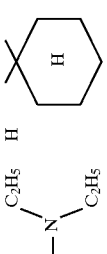 | 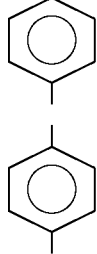 | 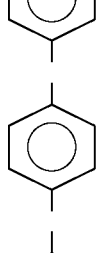 | 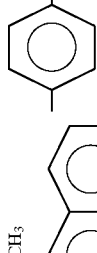 | 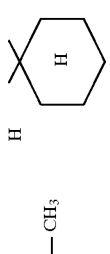 | H |  |

TABLE 4

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 19 | phenyl | 4-OCH₃-phenyl | phenyl | phenyl | phenyl | 4-CH₃-phenyl | 1,4-di-CH₃-naphthyl | 4-OCH₃-phenyl | H | cyclohexyl-H |
| 20 | phenyl | 4-OCH₃-phenyl | phenyl | phenyl | phenyl | 4-CH₃-phenyl | 1,4-di-CH₃-naphthyl | 3,5-di-CH₃-phenyl | H | cyclohexyl-H |
| 21 | phenyl | 4-OCH₃-phenyl | phenyl | phenyl | phenyl | 4-CH₃-phenyl | 1,4-di-CH₃-naphthyl | 3-OCH₃-phenyl | H | cyclohexyl-H |
| 22 | phenyl | 4-OCH₃-phenyl | phenyl | phenyl | phenyl | 4-CH₃-phenyl | 1,4-di-CH₃-naphthyl | 3,5-di-CH₃-phenyl | H | cyclohexyl-H |

TABLE 4-continued

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 23 | phenyl | 4-OCH₃-phenyl | phenyl | phenyl | phenyl | 4-CH₃-phenyl | 1,5-dimethylnaphthyl | 4-(N(C₂H₅)₂)-phenyl | H | cyclohexyl |
| 24 | phenyl | 4-OCH₃-phenyl | phenyl | phenyl | phenyl | 4-CH₃-phenyl | 1,5-dimethylnaphthyl | 4-CH₃-phenyl | H | cyclohexyl |

TABLE 5

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 25 | phenyl | 4-methylphenyl | 1-naphthyl | 1-naphthyl | phenyl | 4-methylphenyl | 4-methoxyphenyl | phenyl | H | cyclohexyl |
| 26 | phenyl | 4-methylphenyl | 1-naphthyl | 1-naphthyl | phenyl | 4-methoxyphenyl | 3,5-dimethylphenyl | 3,5-dimethylphenyl | H | cyclohexyl |
| 27 | phenyl | 3,5-dimethylphenyl | 1-naphthyl | 1-naphthyl | phenyl | 3,5-dimethylphenyl | 4-methoxyphenyl | phenyl | H | cyclohexyl |
| 28 | phenyl | 4-methylphenyl | 1-naphthyl | 1-naphthyl | phenyl | 4-methylphenyl | 4-methylphenyl | 4-methylphenyl | H | cyclohexyl |

TABLE 5-continued

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 29 | phenyl | 4-methylphenyl | naphthyl | naphthyl | phenyl | 4-methylphenyl | 4-(N,N-diethylamino)phenyl | phenyl | H | cyclohexyl-H |
| 30 | phenyl | 4-methylphenyl | naphthyl | naphthyl | phenyl | 4-methylphenyl | 4-(N,N-diethylamino)phenyl | 4-(N,N-diethylamino)phenyl | H | cyclohexyl-H |

TABLE 6

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 31 | C₆H₄- | 4-CH₃-C₆H₄- | 1-naphthyl (4-CH₃) | C₆H₄- | C₆H₄- | 4-CH₃-C₆H₄- | 3,5-(CH₃)₂-C₆H₃- | 4-CH₃-C₆H₄- | H | cyclohexyl |
| 32 | C₆H₄- | 4-OCH₃-C₆H₄- | 1-naphthyl (4-CH₃) | C₆H₄- | C₆H₄- | 4-CH₃-C₆H₄- | 4-N(C₂H₅)₂-C₆H₄- | 4-CH₃-C₆H₄- | H | cyclohexyl |
| 33 | C₆H₄- | 4-OCH₃-C₆H₄- | 1-naphthyl (4-CH₃) | C₆H₄- | C₆H₄- | 4-CH₃-C₆H₄- | 4-N(C₂H₅)₂-C₆H₄- | 4-N(C₂H₅)₂-C₆H₄- | H | cyclohexyl |
| 34 | C₆H₄- | 4-OCH₃-C₆H₄- | 1-naphthyl (4-CH₃) | C₆H₄- | C₆H₄- | 4-CH₃-C₆H₄- | 4-CH₃-C₆H₄- | 4-CH₃-C₆H₄- | H | cyclohexyl |

TABLE 6-continued
| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 35 |  |  |  |  |  |  |  |  | H |  |
| 36 |  |  |  |  |  |  |  |  | H |  |

TABLE 7

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 37 | naphthyl | 4-methylphenyl | phenyl | phenyl | naphthyl | 4-methylphenyl | phenyl | phenyl | H | cyclohexyl |
| 38 | naphthyl | 4-methylphenyl | phenyl | phenyl | naphthyl | 4-methylphenyl | 4-methylphenyl | 4-methylphenyl | H | cyclohexyl |
| 39 | naphthyl | 4-methylphenyl | phenyl | phenyl | naphthyl | 4-methylphenyl | 3,5-dimethylphenyl | phenyl | H | cyclohexyl |
| 40 | naphthyl | 4-methylphenyl | phenyl | phenyl | naphthyl | 4-methylphenyl | 4-(N,N-diethylamino)phenyl | phenyl | H | cyclohexyl |

TABLE 7-continued

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 41 | naphthyl | 4-CH₃-phenyl | phenyl | phenyl | naphthyl | 4-CH₃-phenyl | 4-(N(C₂H₅)₂)-phenyl | 4-(N(C₂H₅)₂)-phenyl | H | cyclohexyl, H |
| 42 | naphthyl | 4-CH₃-phenyl | phenyl | phenyl | naphthyl | 4-CH₃-phenyl | 4-OCH₃-phenyl | phenyl | H | cyclohexyl, H |

TABLE 8

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 43 | naphthyl | 4-methylphenyl | phenyl | phenyl | naphthyl | 4-methylphenyl | 3-methoxyphenyl | phenyl | H | cyclohexyl-H |
| 44 | naphthyl | 1,4-dimethylnaphthyl | phenyl | phenyl | naphthyl | 1,4-dimethylnaphthyl | 4-chlorophenyl | phenyl | H | cyclohexyl-H |
| 45 | naphthyl | 1,4-dimethylnaphthyl | phenyl | phenyl | naphthyl | 1,4-dimethylnaphthyl | 4-ethylphenyl | 4-ethylphenyl | H | cyclohexyl-H |
| 46 | naphthyl | 1,4-dimethylnaphthyl | phenyl | phenyl | naphthyl | 1,4-dimethylnaphthyl | 4-methylphenyl | 4-methylphenyl | H | cyclohexyl-H |

TABLE 8-continued

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 47 | 1-methylnaphthyl | 1,8-dimethylnaphthyl | phenyl | phenyl | 1-naphthyl | 1,8-dimethylnaphthyl | 4-(N,N-diethylamino)phenyl | 4-methylphenyl | H | cyclohexyl |
| 48 | 1-methylnaphthyl | 1,8-dimethylnaphthyl | phenyl | phenyl | 1-naphthyl | 1,8-dimethylnaphthyl | 3,5-dimethylphenyl | phenyl | H | cyclohexyl |

TABLE 9
| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 49 | 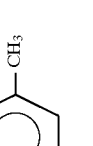 |  | 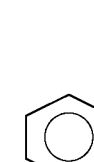 |  | 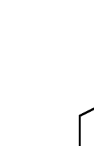 | 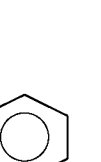 |  | 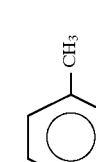 | H |  |
| 50 |  |  |  |  |  | 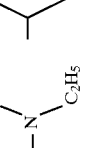 |  | 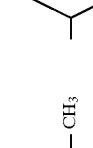 | H |  |
| 51 |  |  | 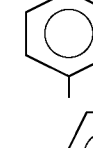 | 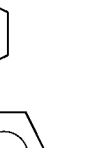 | 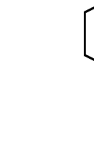 |  |  | 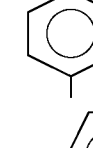 | H | 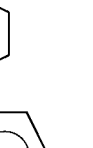 |
| 52 |  | 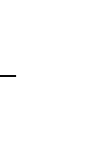 | 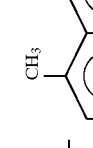 | 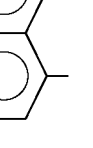 |  | 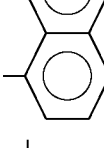 | 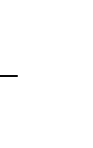 | 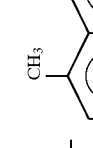 | H | 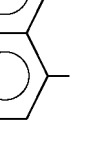 |

TABLE 9-continued

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 53 | naphthyl-CH₃ | naphthyl-CH₃ | tolyl-CH₃ | tolyl-CH₃ | naphthyl | naphthyl-CH₃ | 3,5-dimethylphenyl | phenyl | H | cyclohexyl-H |
| 54 | naphthyl-CH₃ | naphthyl-CH₃ | tolyl-CH₃ | tolyl-CH₃ | naphthyl | naphthyl-CH₃ | 4-(N,N-diethylamino)phenyl | 4-(N,N-diethylamino)phenyl | H | cyclohexyl-H |

TABLE 10

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 55 | naphthyl | CH₃-naphthyl | 2-CH₃,4-CH₃-phenyl | 2-CH₃,4-CH₃-phenyl | naphthyl | CH₃-naphthyl | 3-OCH₃-phenyl | 2-CH₃-phenyl | H | cyclohexyl-H |
| 56 | naphthyl | CH₃-naphthyl | 2-CH₃,4-CH₃-phenyl | 2-CH₃,4-CH₃-phenyl | naphthyl | CH₃-naphthyl | 4-Cl-phenyl | 2-CH₃-phenyl | H | cyclohexyl-H |
| 57 | 4-CH₃-phenyl | 4-CH₃-phenyl | 2-CH₃,4-CH₃-phenyl | 2-CH₃,4-CH₃-phenyl | phenyl | 4-CH₃-phenyl | 4-CH₃-phenyl | 4-CH₃-phenyl | H | cyclohexyl-H |
| 58 | phenyl | 4-CH₃-phenyl | 2-CH₃,4-CH₃-phenyl | 2-CH₃,4-CH₃-phenyl | phenyl | 4-CH₃-phenyl | 3,5-(CH₃)₂-phenyl | phenyl | H | cyclohexyl-H |
| 59 | 4-CH₃-phenyl | 4-CH₃-phenyl | 2-CH₃,4-CH₃-phenyl | 2-CH₃,4-CH₃-phenyl | phenyl | 4-CH₃-phenyl | 4-N(C₂H₅)₂-phenyl | 4-N(C₂H₅)₂-phenyl | H | cyclohexyl-H |
| 60 | 4-CH₃-phenyl | 4-CH₃-phenyl | 2-CH₃,4-CH₃-phenyl | 2-CH₃,4-CH₃-phenyl | phenyl | 4-CH₃-phenyl | 4-OCH₃-phenyl | phenyl | H | cyclohexyl-H |

TABLE 11

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 61 | phenyl | 4-CH₃-phenyl | 2-CH₃-phenyl | 2-CH₃-phenyl | phenyl | 4-CH₃-phenyl | 4-N(C₂H₅)₂-phenyl | phenyl | H | cyclohexyl |
| 62 | phenyl | phenyl | 2-CH₃-phenyl | 2-CH₃-phenyl | phenyl | 3,5-diCH₃-phenyl | 3-OCH₃-phenyl | phenyl | H | cyclohexyl |
| 63 | phenyl | phenyl | 2-CH₃-phenyl | 2-CH₃-phenyl | phenyl | 3,5-diCH₃-phenyl | 3-Cl-phenyl | phenyl | H | cyclohexyl |
| 64 | 2-CH₃-phenyl | 4-CH₃-phenyl | 2-CH₃-phenyl | 2-CH₃-phenyl | 2-CH₃-phenyl | 4-CH₃-phenyl | 4-CH₃-phenyl | 4-CH₃-phenyl | H | cyclohexyl |
| 65 | 2-CH₃-phenyl | 4-CH₃-phenyl | 2-CH₃-phenyl | 2-CH₃-phenyl | 2-CH₃-phenyl | 4-CH₃-phenyl | 3-CH₃-phenyl | 3-CH₃-phenyl | H | cyclohexyl |
| 66 | 2-CH₃-phenyl | 4-CH₃-phenyl | 2-CH₃-phenyl | 2-CH₃-phenyl | 2-CH₃-phenyl | 4-CH₃-phenyl | 3,5-diCH₃-phenyl | phenyl | H | cyclohexyl |

TABLE 12

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 67 | 2,4-diMe-C₆H₃ | 3,5-diMe-C₆H₃ | 2,4-diMe-C₆H₃ | 2,4-diMe-C₆H₃ | 2,4-diMe-C₆H₃ | 3,5-diMe-C₆H₃ | 3-OMe-4-Me-C₆H₃ | C₆H₄-4-Me | H | cyclohexyl |
| 68 | 2,4-diMe-C₆H₃ | 3,5-diMe-C₆H₃ | 2,4-diMe-C₆H₃ | 2,4-diMe-C₆H₃ | 2,4-diMe-C₆H₃ | 3,5-diMe-C₆H₃ | 4-NEt₂-C₆H₄ | C₆H₄-4-Me | H | cyclohexyl |
| 69 | 2,4-diMe-C₆H₃ | 3,5-diMe-C₆H₃ | 2,4-diMe-C₆H₃ | 2,4-diMe-C₆H₃ | 2,4-diMe-C₆H₃ | 3,5-diMe-C₆H₃ | 4-NEt₂-C₆H₄ | 4-NEt₂-C₆H₄ | H | cyclohexyl |
| 70 | 2,4-diMe-C₆H₃ | 4-NEt₂-C₆H₄ | 2,4-diMe-C₆H₃ | 2,4-diMe-C₆H₃ | 2,4-diMe-C₆H₃ | 4-NEt₂-C₆H₄ | 4-OMe-C₆H₄ | C₆H₄-4-Me | H | cyclohexyl |
| 71 | 2,4-diMe-C₆H₃ | 4-NEt₂-C₆H₄ | 2,4-diMe-C₆H₃ | 2,4-diMe-C₆H₃ | 2,4-diMe-C₆H₃ | 4-NEt₂-C₆H₄ | 4-Cl-C₆H₄ | C₆H₄-4-Me | H | cyclohexyl |
| 72 | 2,4-diMe-C₆H₃ | 4-NEt₂-C₆H₄ | 2,4-diMe-C₆H₃ | 2,4-diMe-C₆H₃ | 2,4-diMe-C₆H₃ | 4-NEt₂-C₆H₄ | 3-OMe-4-Me-C₆H₃ | C₆H₄-4-Me | H | cyclohexyl |

TABLE 13

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 73 | –C₆H₅ | 4-CH₃-C₆H₄– | –C₆H₅ | –C₆H₅ | –C₆H₅ | 4-CH₃-C₆H₄– | –C₆H₅ | –C₆H₅ | H | –C(CH₃)₂– |
| 74 | –C₆H₅ | 4-CH₃-C₆H₄– | –C₆H₅ | –C₆H₅ | –C₆H₅ | 4-CH₃-C₆H₄– | 4-CH₃-C₆H₄– | 4-CH₃-C₆H₄– | H | –C(CH₃)₂– |
| 75 | –C₆H₅ | 4-CH₃-C₆H₄– | –C₆H₅ | –C₆H₅ | –C₆H₅ | 4-CH₃-C₆H₄– | 4-OCH₃-C₆H₄– | 4-OCH₃-C₆H₄– | H | –C(CH₃)₂– |
| 76 | –C₆H₅ | 4-CH₃-C₆H₄– | –C₆H₅ | –C₆H₅ | –C₆H₅ | 4-CH₃-C₆H₄– | 3,5-(CH₃)₂-C₆H₃– | 3,5-(CH₃)₂-C₆H₃– | H | –C(CH₃)₂– |
| 77 | 4-Cl-C₆H₄– | 4-OCH₃-C₆H₄– | –C₆H₅ | –C₆H₅ | –C₆H₅ | 4-OCH₃-C₆H₄– | 4-Cl-C₆H₄– | –C₆H₅ | H | –C(CH₃)₂– |
| 78 | –C₆H₅ | 4-CH₃-C₆H₄– | –C₆H₅ | –C₆H₅ | –C₆H₅ | 4-CH₃-C₆H₄– | –C₆H₅ | 4-CH₃-C₆H₄– | H | –C(CH₃)₂– |

TABLE 14

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 79 | phenyl | 4-CH₃-phenyl | phenyl | phenyl | phenyl | 4-CH₃-phenyl | 4-OCH₃-phenyl | phenyl | H | $-C(CH_3)_3$ |
| 80 | phenyl | 4-CH₃-phenyl | phenyl | phenyl | phenyl | 4-CH₃-phenyl | 3-OCH₃-phenyl | phenyl | H | $-C(CH_3)_3$ |
| 81 | phenyl | 3,5-(CH₃)₂-phenyl | phenyl | phenyl | phenyl | 3,5-(CH₃)₂-phenyl | 4-N(C₂H₅)₂-phenyl | phenyl | H | $-C(CH_3)_3$ |
| 82 | phenyl | 4-N(C₂H₅)₂-phenyl | phenyl | phenyl | phenyl | 4-N(C₂H₅)₂-phenyl | 4-N(C₂H₅)₂-phenyl | 4-N(C₂H₅)₂-phenyl | H | $-C(CH_3)_3$ |
| 83 | phenyl | 4-N(C₂H₅)₂-phenyl | phenyl | phenyl | phenyl | 4-N(C₂H₅)₂-phenyl | 4-C₂H₅-phenyl | 4-C₂H₅-phenyl | H | $-C(CH_3)_3$ |
| 84 | phenyl | 4-CH₃-phenyl | phenyl | phenyl | phenyl | 4-OCH₃-phenyl | 3-CH₃-phenyl | phenyl | H | $-C(CH_3)_3$ |

TABLE 15

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 85 | C₆H₅ | 4-CH₃-C₆H₄ | C₆H₄ | C₆H₄ | C₆H₄ | 4-CH₃-C₆H₄ | C₆H₄ | C₆H₄ | H | (CH₃)₂CH—C(CH₃)₂— |
| 86 | C₆H₅ | 4-CH₃-C₆H₄ | C₆H₄ | C₆H₄ | C₆H₄ | 4-CH₃-C₆H₄ | 4-CH₃-C₆H₄ | 4-CH₃-C₆H₄ | H | (CH₃)₂CH—C(CH₃)₂— |
| 87 | C₆H₅ | 4-CH₃-C₆H₄ | C₆H₄ | C₆H₄ | C₆H₄ | 4-CH₃-C₆H₄ | 4-OCH₃-C₆H₄ | 4-OCH₃-C₆H₄ | H | (CH₃)₂CH—C(CH₃)₂— |
| 88 | C₆H₅ | 4-CH₃-C₆H₄ | C₆H₄ | C₆H₄ | C₆H₄ | 4-CH₃-C₆H₄ | 3,5-(CH₃)₂-C₆H₃ | 3,5-(CH₃)₂-C₆H₃ | H | (CH₃)₂CH—C(CH₃)₂— |
| 89 | C₆H₅ | 4-OCH₃-C₆H₄ | C₆H₄ | C₆H₄ | C₆H₄ | 4-CH₃-C₆H₄ | 4-N(C₂H₅)₂-C₆H₄ | C₆H₄ | H | (CH₃)₂CH—C(CH₃)₂— |
| 90 | C₆H₅ | 4-OCH₃-C₆H₄ | C₆H₄ | C₆H₄ | C₆H₄ | 4-CH₃-C₆H₄ | 4-OCH₃-C₆H₄ | C₆H₄ | H | (CH₃)₂CH—C(CH₃)₂— |

TABLE 16

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 91 | –C₆H₅ | –C₆H₄–N(C₂H₅)₂ | –C₆H₄– | –C₆H₄– | –C₆H₄– | –C₆H₄–N(C₂H₅)₂ | –C₆H₄–OCH₃ | –C₆H₅ | H | (CH₃)₂CH–C(CH₃)₂–CH₃ |
| 92 | –C₆H₅ | –C₆H₄–CH₃ | –C₆H₄– | –C₆H₄– | –C₆H₄– | –C₆H₄–CH₃ | –C₆H₄–N(C₂H₅)₂ | –C₆H₄–N(C₂H₅)₂ | H | (CH₃)₂CH–C(CH₃)₂–CH₃ |
| 93 | –C₆H₅ | –C₆H₄–CH₃ | –C₆H₄– | –C₆H₄– | –C₆H₄– | –C₆H₄–CH₃ | –C₆H₄–C₂H₅ | –C₆H₄–C₂H₅ | H | (CH₃)₂CH–C(CH₃)₂–CH₃ |
| 94 | –C₆H₅ | –C₆H₃(CH₃)₂ | –C₆H₄– | –C₆H₄– | –C₆H₄– | –C₆H₃(CH₃)₂ | –C₆H₄–CH₃ | –C₆H₄–CH₃ | H | (CH₃)₂CH–C(CH₃)₂–CH₃ |
| 95 | –C₆H₅ | –C₆H₄–CH₃ | –C₆H₄– | –C₆H₄– | –C₆H₄– | –C₆H₄–CH₃ | –C₆H₅ | –C₆H₅ | H | –O– |
| 96 | –C₆H₅ | –C₆H₄–CH₃ | –C₆H₄– | –C₆H₄– | –C₆H₄– | –C₆H₄–CH₃ | –C₆H₄–CH₃ | –C₆H₄–CH₃ | H | –O– |

TABLE 17

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 97 | –C₆H₄– | –C₆H₄–CH₃ | –C₆H₄– | –C₆H₄– | –C₆H₄– | –C₆H₄–CH₃ | –C₆H₄–OCH₃ | –C₆H₄–OCH₃ | H | –O– |
| 98 | –C₆H₄– | –C₆H₄–OCH₃ | –C₆H₄– | –C₆H₄– | –C₆H₄– | –C₆H₄–OCH₃ | 3,5-(CH₃)₂–C₆H₃– | 3,5-(CH₃)₂–C₆H₃– | H | –O– |
| 99 | –C₆H₄– | –C₆H₄–OCH₃ | –C₆H₄– | –C₆H₄– | –C₆H₄– | –C₆H₄–OCH₃ | –C₆H₄–N(C₂H₅)₂ | –C₆H₄– | H | –O– |
| 100 | –C₆H₄– | –C₆H₄–OCH₃ | –C₆H₄– | –C₆H₄– | –C₆H₄– | –C₆H₄–OCH₃ | –C₆H₄–OCH₃ | –C₆H₄– | H | –O– |
| 101 | –C₆H₄– | –C₆H₄–OCH₃ | –C₆H₄– | –C₆H₄– | –C₆H₄– | –C₆H₄–OCH₃ | 3-OCH₃–C₆H₄– | –C₆H₄– | H | –O– |
| 102 | –C₆H₄– | –C₆H₄–N(C₂H₅)₂ | –C₆H₄– | –C₆H₄– | –C₆H₄– | –C₆H₄–N(C₂H₅)₂ | –C₆H₄–N(C₂H₅)₂ | –C₆H₄–N(C₂H₅)₂ | H | –O– |

TABLE 18

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 103 | -C₆H₄- | -C₆H₄-N(C₂H₅)₂ | -C₆H₄- | -C₆H₄- | -C₆H₄- | -C₆H₄-N(C₂H₅)₂ | -C₆H₄-C₂H₅ | -C₆H₄-C₂H₅ | H | —O— |
| 104 | -C₆H₄- | 3,5-(CH₃)₂-C₆H₃- | -C₆H₄- | -C₆H₄- | -C₆H₄- | 3,5-(CH₃)₂-C₆H₃- | 3-CH₃-C₆H₄- | 3-CH₃-C₆H₄- | H | —O— |
| 105 | -C₆H₄- | -C₆H₄-CH₃ | -C₆H₄- | -C₆H₄- | -C₆H₄- | -C₆H₄-CH₃ | -C₆H₅ | -C₆H₅ | H | —S— |
| 106 | -C₆H₄- | -C₆H₄-CH₃ | -C₆H₄- | -C₆H₄- | -C₆H₄- | -C₆H₄-CH₃ | -C₆H₄-CH₃ | -C₆H₄-CH₃ | H | —S— |
| 107 | -C₆H₄- | -C₆H₄-OCH₃ | -C₆H₄- | -C₆H₄- | -C₆H₄- | -C₆H₄-CH₃ | -C₆H₄-OCH₃ | -C₆H₄-OCH₃ | H | —S— |
| 108 | -C₆H₄- | -C₆H₄-OCH₃ | -C₆H₄- | -C₆H₄- | -C₆H₄- | -C₆H₄-CH₃ | 3,5-(CH₃)₂-C₆H₃- | 3,5-(CH₃)₂-C₆H₃- | H | —S— |

TABLE 19

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 109 | phenyl | 4-OCH₃-phenyl | phenyl | phenyl | phenyl | 4-CH₃-phenyl | 4-N(C₂H₅)₂-phenyl | phenyl | H | —S— |
| 110 | phenyl | 4-N(C₂H₅)₂-phenyl | phenyl | phenyl | phenyl | 4-N(C₂H₅)₂-phenyl | 4-OCH₃-phenyl | phenyl | H | —S— |
| 111 | phenyl | 4-N(C₂H₅)₂-phenyl | phenyl | phenyl | phenyl | 4-N(C₂H₅)₂-phenyl | 3-OCH₃-phenyl | phenyl | H | —S— |
| 112 | phenyl | 4-N(C₂H₅)₂-phenyl | phenyl | phenyl | phenyl | 4-N(C₂H₅)₂-phenyl | 4-N(C₂H₅)₂-phenyl | 4-N(C₂H₅)₂-phenyl | H | —S— |
| 113 | phenyl | 3,5-di-CH₃-phenyl | phenyl | phenyl | phenyl | 3,5-di-CH₃-phenyl | 4-C₂H₅-phenyl | 4-C₂H₅-phenyl | H | —S— |
| 114 | phenyl | 3,5-di-CH₃-phenyl | phenyl | phenyl | phenyl | 3,5-di-CH₃-phenyl | 3-CH₃-phenyl | 3-CH₃-phenyl | H | —S— |

TABLE 20

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 115 | Ph | 4-CH₃-Ph | Ph | Ph | Ph | 4-CH₃-Ph | Ph | Ph | H | 4-CH₃O-C₆H₄-N= |
| 116 | Ph | 4-CH₃-Ph | Ph | Ph | Ph | 4-CH₃-Ph | 4-CH₃-Ph | 4-CH₃-Ph | H | 4-CH₃O-C₆H₄-N= |
| 117 | Ph | 4-CH₃-Ph | Ph | Ph | Ph | 4-CH₃-Ph | 4-OCH₃-Ph | 4-OCH₃-Ph | H | 4-CH₃O-C₆H₄-N= |
| 118 | Ph | 4-CH₃-Ph | Ph | Ph | Ph | 4-CH₃-Ph | 3,5-(CH₃)₂-Ph | 3,5-(CH₃)₂-Ph | H | 4-CH₃O-C₆H₄-N= |
| 119 | Ph | 4-CH₃-Ph | Ph | Ph | Ph | 4-OCH₃-Ph | 4-N(C₂H₅)₂-Ph | Ph | H | 4-CH₃O-C₆H₄-N= |
| 120 | Ph | 4-CH₃-Ph | Ph | Ph | Ph | 4-OCH₃-Ph | 4-OCH₃-Ph | Ph | H | 4-CH₃O-C₆H₄-N= |

TABLE 21

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 121 | –⌬ | –⌬–CH₃ | –⌬ | –⌬ | –⌬ | –⌬–CH₃ | –⌬–OCH₃ | –⌬ | H | CH₃O–⌬–N= |
| 122 | –⌬ | –⌬–CH₃ | –⌬ | –⌬ | –⌬ | –⌬–CH₃ | –⌬–N(C₂H₅)₂ | –⌬–N(C₂H₅)₂ | H | CH₃O–⌬–N= |
| 123 | –⌬ | –⌬–CH₃ | –⌬ | –⌬ | –⌬ | –⌬–CH₃ | –⌬–C₂H₅ | –⌬–C₂H₅ | H | CH₃O–⌬–N= |
| 124 | –⌬ | –⌬–N(C₂H₅)₂ | –⌬ | –⌬ | –⌬ | –⌬–N(C₂H₅)₂ | –⌬–CH₃ | –⌬–CH₃ | H | CH₃O–⌬–N= |
| 125 | –⌬ | –⌬–CH₃ | –⌬ | –⌬ | –⌬ | –⌬–CH₃ | –⌬ | –⌬ | H | CH₃O–⌬–N= |
| 126 | –⌬ | –⌬–CH₃ | –⌬ | –⌬ | –⌬ | –⌬–CH₃ | –⌬–CH₃ | –⌬–CH₃ | H | CH₃O–⌬–N= |

TABLE 22

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 127 | ⌬ | ⌬—CH₃ | ⌬ | ⌬ | ⌬ | ⌬—CH₃ | ⌬—OCH₃ | ⌬—OCH₃ | H | CH₃—⌬—N< |
| 128 | ⌬ | ⌬—N(C₂H₅)₂ | ⌬ | ⌬ | ⌬ | ⌬—N(C₂H₅)₂ | 3,5-(CH₃)₂-⌬ | 3,5-(CH₃)₂-⌬ | H | CH₃—⌬—N< |
| 129 | ⌬ | ⌬—OCH₃ | ⌬ | ⌬ | ⌬ | ⌬—OCH₃ | ⌬—N(C₂H₅)₂ | ⌬ | H | CH₃—⌬—N< |
| 130 | ⌬ | ⌬—OCH₃ | ⌬ | ⌬ | ⌬ | ⌬—OCH₃ | ⌬—OCH₃ | ⌬ | H | CH₃—⌬—N< |
| 131 | ⌬ | ⌬—N(C₂H₅)₂ | ⌬ | ⌬ | ⌬ | ⌬—N(C₂H₅)₂ | 3-OCH₃-⌬ | ⌬ | H | CH₃—⌬—N< |
| 132 | ⌬ | ⌬—N(C₂H₅)₂ | ⌬ | ⌬ | ⌬ | ⌬—N(C₂H₅)₂ | ⌬—N(C₂H₅)₂ | ⌬—N(C₂H₅)₂ | H | CH₃O—⌬—N< |

TABLE 23

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 133 | –C₆H₅ | 4-(C₂H₅)₂N-C₆H₄– | –C₆H₄– | –C₆H₄– | –C₆H₄– | 4-(C₂H₅)₂N-C₆H₄– | 4-C₂H₅-C₆H₄– | 4-C₂H₅-C₆H₄– | H | 4-CH₃-C₆H₄(N=) |
| 134 | –C₆H₅ | 3,5-(CH₃)₂-C₆H₃– | –C₆H₄– | –C₆H₄– | –C₆H₄– | 3,5-(CH₃)₂-C₆H₃– | 3-CH₃-C₆H₄– | 3-CH₃-C₆H₄– | H | 4-CH₃-C₆H₄(N=) |
| 135 | –C₆H₅ | 4-CH₃-C₆H₄– | –C₆H₄– | –C₆H₄– | –C₆H₄– | 4-CH₃-C₆H₄– | –C₆H₅ | –C₆H₅ | H | 4-(C₂H₅)₂N-C₆H₄(N=) |
| 136 | –C₆H₅ | 4-CH₃-C₆H₄– | –C₆H₄– | –C₆H₄– | –C₆H₄– | 4-CH₃-C₆H₄– | 4-CH₃-C₆H₄– | 4-CH₃-C₆H₄– | H | 4-(C₂H₅)₂N-C₆H₄(N=) |
| 137 | –C₆H₅ | 4-CH₃-C₆H₄– | –C₆H₄– | –C₆H₄– | –C₆H₄– | 4-CH₃-C₆H₄– | 4-OCH₃-C₆H₄– | 4-OCH₃-C₆H₄– | H | 4-(C₂H₅)₂N-C₆H₄(N=) |
| 138 | –C₆H₅ | 4-CH₃-C₆H₄– | –C₆H₄– | –C₆H₄– | –C₆H₄– | 4-CH₃-C₆H₄– | 3,5-(CH₃)₂-C₆H₃– | 3,5-(CH₃)₂-C₆H₃– | H | 4-(C₂H₅)₂N-C₆H₄(N=) |

TABLE 24

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 139 | –C₆H₄– | –C₆H₄–CH₃ | –C₆H₄– | –C₆H₄– | –C₆H₄– | –C₆H₄–CH₃ | –C₆H₄–N(C₂H₅)₂ | –C₆H₅ | H | –C₆H₄–N(C₂H₅)₂–N= |
| 140 | –C₆H₄– | –C₆H₄–N(C₂H₅)₂ | –C₆H₄– | –C₆H₄– | –C₆H₄– | –C₆H₄–N(C₂H₅)₂ | –C₆H₄–OCH₃ | –C₆H₅ | H | –C₆H₄–N(C₂H₅)₂–N= |
| 141 | –C₆H₄– | –C₆H₄–N(C₂H₅)₂ | –C₆H₄– | –C₆H₄– | –C₆H₄– | –C₆H₄–N(C₂H₅)₂ | –C₆H₄(m-OCH₃)– | –C₆H₅ | H | –C₆H₄–N(C₂H₅)₂–N= |
| 142 | –C₆H₄– | –C₆H₄–CH₃ | –C₆H₄– | –C₆H₄– | –C₆H₄– | –C₆H₄–CH₃ | –C₆H₄–N(C₂H₅)₂ | –C₆H₄–N(C₂H₅)₂ | H | –C₆H₄–N(C₂H₅)₂–N= |
| 143 | –C₆H₄– | –C₆H₄–CH₃ | –C₆H₄– | –C₆H₄– | –C₆H₄– | –C₆H₄–CH₃ | –C₆H₄–C₂H₅ | –C₆H₄–C₂H₅ | H | –C₆H₄–N(C₂H₅)₂–N= |
| 144 | –C₆H₄– | –C₆H₄–CH₃ | –C₆H₄– | –C₆H₄– | –C₆H₄– | –C₆H₄–CH₃ | –C₆H₃(CH₃)₂– | –C₆H₃(CH₃)₂– | H | –C₆H₄–N(C₂H₅)₂–N= |

TABLE 25

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 145 | C₆H₅ | 4-CH₃-C₆H₄ | C₆H₅ | C₆H₅ | C₆H₅ | 4-CH₃-C₆H₄ | C₆H₅ | C₆H₅ | H | 3-CH₃-C₆H₄-N= |
| 146 | C₆H₅ | 4-CH₃-C₆H₄ | C₆H₅ | C₆H₅ | C₆H₅ | 4-CH₃-C₆H₄ | 4-CH₃-C₆H₄ | 4-CH₃-C₆H₄ | H | 3-CH₃-C₆H₄-N= |
| 147 | C₆H₅ | 4-CH₃-C₆H₄ | C₆H₅ | C₆H₅ | C₆H₅ | 4-CH₃-C₆H₄ | 4-OCH₃-C₆H₄ | 4-OCH₃-C₆H₄ | H | 3-CH₃-C₆H₄-N= |
| 148 | C₆H₅ | 4-OCH₃-C₆H₄ | C₆H₅ | C₆H₅ | C₆H₅ | 4-OCH₃-C₆H₄ | 3,5-(CH₃)₂-C₆H₃ | 3,5-(CH₃)₂-C₆H₃ | H | 3-CH₃-C₆H₄-N= |
| 149 | C₆H₅ | 4-OCH₃-C₆H₄ | C₆H₅ | C₆H₅ | C₆H₅ | 4-OCH₃-C₆H₄ | 4-(N(C₂H₅)₂)-C₆H₄ | C₆H₅ | H | 3-CH₃-C₆H₄-N= |
| 150 | C₆H₅ | 4-(N(C₂H₅)₂)-C₆H₄ | C₆H₅ | C₆H₅ | C₆H₅ | 4-(N(C₂H₅)₂)-C₆H₄ | 4-OCH₃-C₆H₄ | C₆H₅ | H | 3-CH₃-C₆H₄-N= |

TABLE 26

| Compound | Ar¹ | Ar² | Ar³ | Ar⁴ | Ar⁵ | Ar⁶ | Ar⁷ | Ar⁸ | R¹ | A |
|---|---|---|---|---|---|---|---|---|---|---|
| 151 | -C₆H₄- | 4-(N(C₂H₅)₂)-C₆H₄- | -C₆H₄- | -C₆H₄- | -C₆H₄- | 4-(N(C₂H₅)₂)-C₆H₄- | 3-OCH₃-C₆H₄- | -C₆H₄- | H | 3-CH₃-C₆H₄-N< |
| 152 | -C₆H₄- | 4-(N(C₂H₅)₂)-C₆H₄- | -C₆H₄- | -C₆H₄- | -C₆H₄- | 4-(N(C₂H₅)₂)-C₆H₄- | 4-(N(C₂H₅)₂)-C₆H₄- | 4-(N(C₂H₅)₂)-C₆H₄- | H | 3-CH₃-C₆H₄-N< |
| 153 | -C₆H₄- | 3,5-(CH₃)₂-C₆H₃- | -C₆H₄- | -C₆H₄- | -C₆H₄- | 3,5-(CH₃)₂-C₆H₃- | 4-C₂H₅-C₆H₄- | 4-C₂H₅-C₆H₄- | H | 3-CH₃-C₆H₄-N< |
| 154 | -C₆H₄- | 4-CH₃-C₆H₄- | -C₆H₄- | -C₆H₄- | -C₆H₄- | 4-CH₃-C₆H₄- | 3-CH₃-C₆H₄- | 3-CH₃-C₆H₄- | H | 3-CH₃-C₆H₄-N< |

EMBODIMENTS

(EXAMPLES 1–20)

A first embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 2, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hyroxyquinolinate aluminum), is formed on the potential barrier layer by the molecular beam epitaxy method under a vacuum pressure of $910^{-9}$ Torr so that the light emission layer has a thickness of 75 nanometers. An aluminum alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.86 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 380 hours at a condition of an initial luminance of 300 cd/m$^2$. This result means that the improved hole transport layer improves the durability.

A second embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 4, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.98 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 315 hours at a condition of an initial luminance of 300 cd/m$^2$. This result means that the improved hole transport layer improves the durability.

A third embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 7, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.12 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 290 hours at a condition of an initial luminance of 300 cd/m$^2$. This result means that the improved hole transport layer improves the durability.

A fourth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 12, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.05 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 270 hours at a condition of an initial luminance of 300 $cd/m^2$. This result means that the improved hole transport layer improves the durability.

A fifth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 18, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.85 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 300 hours at a condition of an initial luminance of 300 $cd/m^2$. This result means that the improved hole transport layer improves the durability.

A sixth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 28, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.91 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 280 hours at a condition of an initial luminance of 300 $cd/m^2$. This result means that the improved hole transport layer improves the durability.

A seventh embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 43, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.85 mA/cm$^2$ is necessary for enabling the device to exhibit a luminance of 100 cd/m . This result means that the improved hole transport layer improves the efficiency of luminance of the device. It was also confirmed that a half-value period of luminance is 210 hours at a condition of an initial luminance of 300 cd/m$^2$. This result means that the improved hole transport layer improves the durability.

An eighth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 57, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.00 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 265 hours at a condition of an initial luminance of 300 cd/m$^2$. This result means that the improved hole transport layer improves the durability.

A ninth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 64, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.10 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 240 hours at a condition of an initial luminance of 300 cd/m$^2$. This result means that the improved hole transport layer improves the durability.

A tenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 78, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.18 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 205 hours at a condition of an initial luminance of 300 cd/m$^2$. This result means that the improved hole transport layer improves the durability.

An eleventh embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 88, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.20 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 200 hours at a condition of an initial luminance of 300 cd/m$^2$. This result means that the improved hole transport layer improves the durability.

A twelfth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 103, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.45 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 195 hours at a condition of an initial luminance of 300 cd/m$^2$. This result means that the improved hole transport layer improves the durability.

A thirteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 106, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.10 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 225 hours at a condition of an initial luminance of 300 cd/m$^2$. This result means that the improved hole transport layer improves the durability.

A fourteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 110, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.25 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 180 hours at a condition of an initial luminance of 300 cd/m$^2$. This result means that the improved hole transport layer improves the durability.

A fifteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 115, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.95 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 315 hours at a condition of an initial luminance of 300 cd/m$^2$. This result means that the improved hole transport layer improves the durability.

A sixteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 121, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.05 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 285 hours at a condition of an initial luminance of 300 cd/m$^2$. This result means that the improved hole transport layer improves the durability.

A seventeenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 124, mentioned on the Table, is formed on the anode layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of 910$^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.98 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 315 hours at a condition of an initial luminance of 300 cd/m$^2$. This result means that the improved hole transport layer improves the durability.

An eighteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 126, mentioned on the Table, is formed on the anode layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of 910$^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.35 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 200 hours at a condition of an initial luminance of 300 cd/m$^2$. This result means that the improved hole transport layer improves the durability.

A nineteenth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 140, mentioned on the Table, is formed on the anode layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of 910$^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.26 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 195 hours at a condition of an initial luminance of 300 cd/m$^2$. This result means that the improved hole transport layer improves the durability.

A twentieth embodiment according to the present invention will be described with reference to FIG. 1. The organic thin film electroluminescent device in this embodiment comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of the compound 150, mentioned on the Table, is formed on the anode layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.25 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 200 hours at a condition of an initial luminance of 300 cd/m$^2$. This result means that the improved hole transport layer improves the durability.

(Comparative Example 1)

A comparative example 1 will be described. The organic thin film electroluminescent device in this comparative example comprises an anode, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole transport layer, made of 1,1-bis-(4-di-para-triaminophenyl)cyclohexane, is formed on the anode layer by the molecular beam epitaxy method under a vacuum pressure of $4.510^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $5.610^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.35 mA/cm$^2$ is necessary for enabling the device to exhibit a luminance of 100 cd/m$^2$. It was also confirmed that a half-value period of luminance is 200 hours at a condition of an initial luminance of 128 cd/m$^2$. This result means that this hole transport layer reduces the durability.

(EXAMPLES 21–41)

Figure 2:
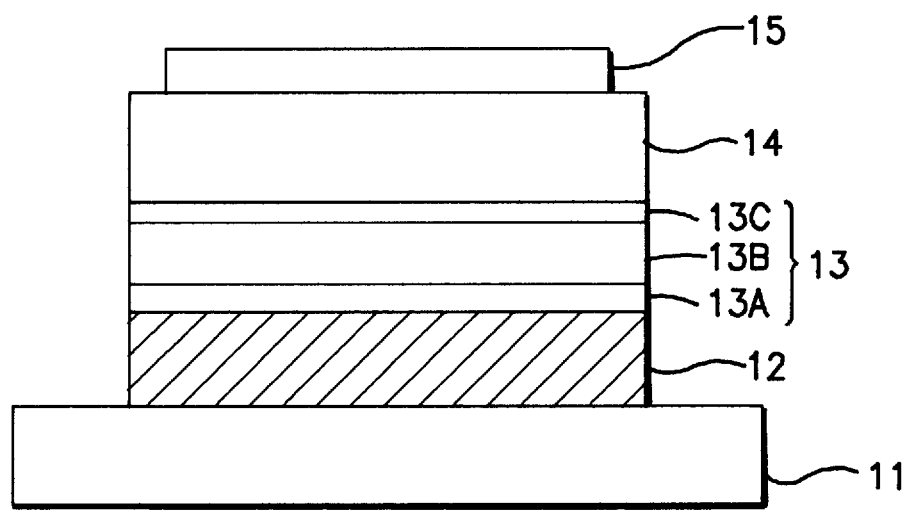
FIG. 2 is a fragmentary cross sectional elevation view illustrative of an organic thin film electroluminescent device in twenty-first to forty-third embodiments according present invention.
Figure 3:
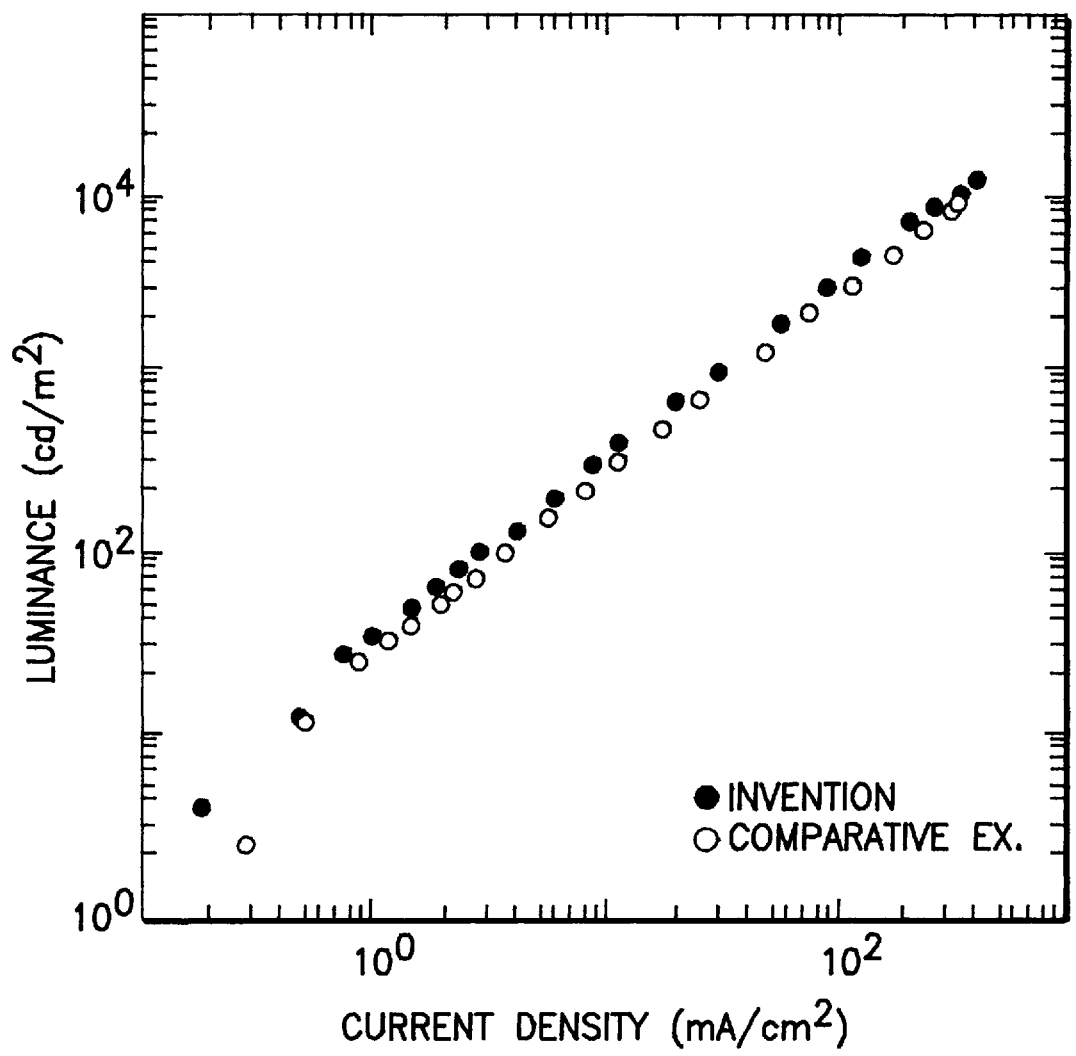
FIG. 3 is a diagram illustrative of the properties of luminance versus a current density of the device in a first embodiment and a first comparative example.
Figure 4:
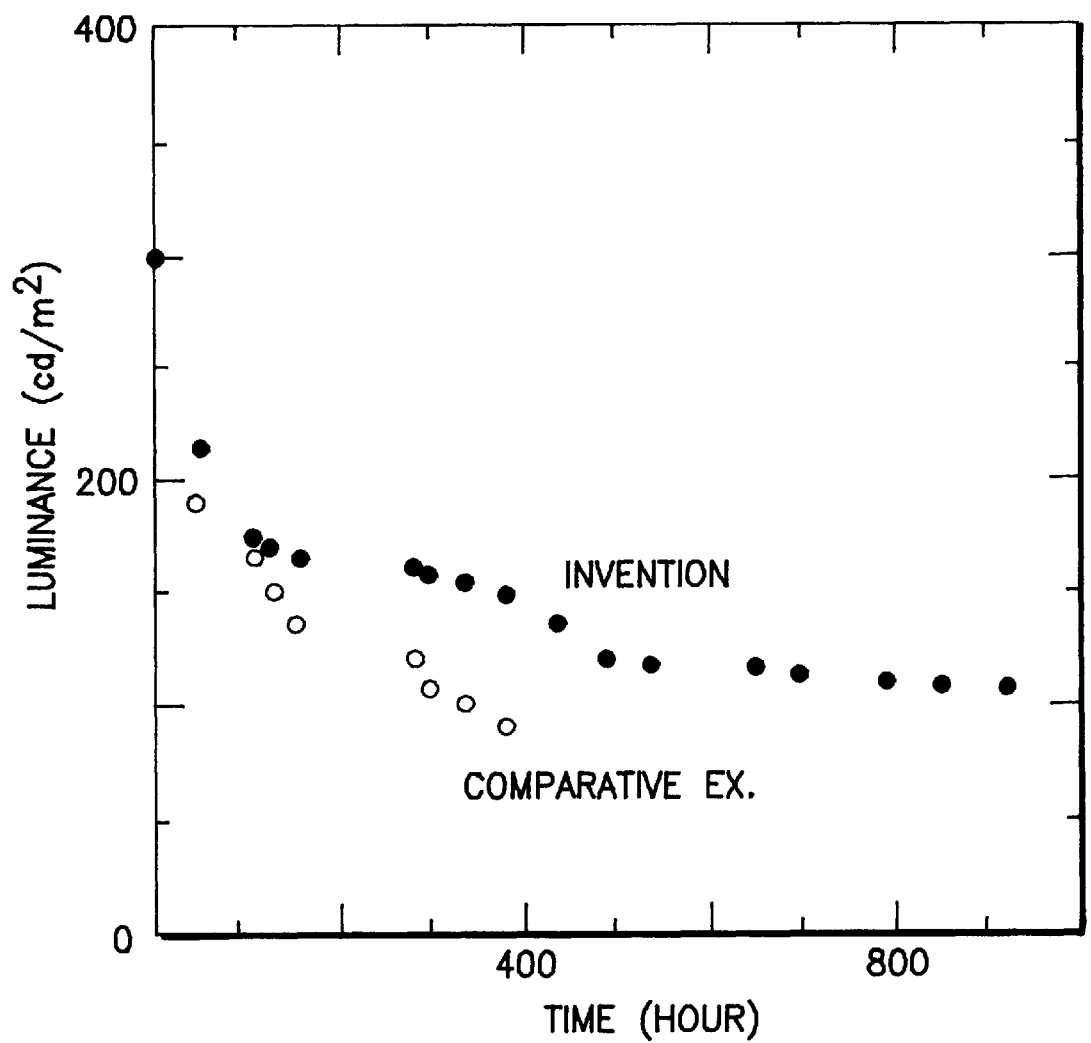
FIG. 4 is a diagram illustrative of the properties of durability versus a current density of the device in a first embodiment and a first comparative example.
Figure 5:
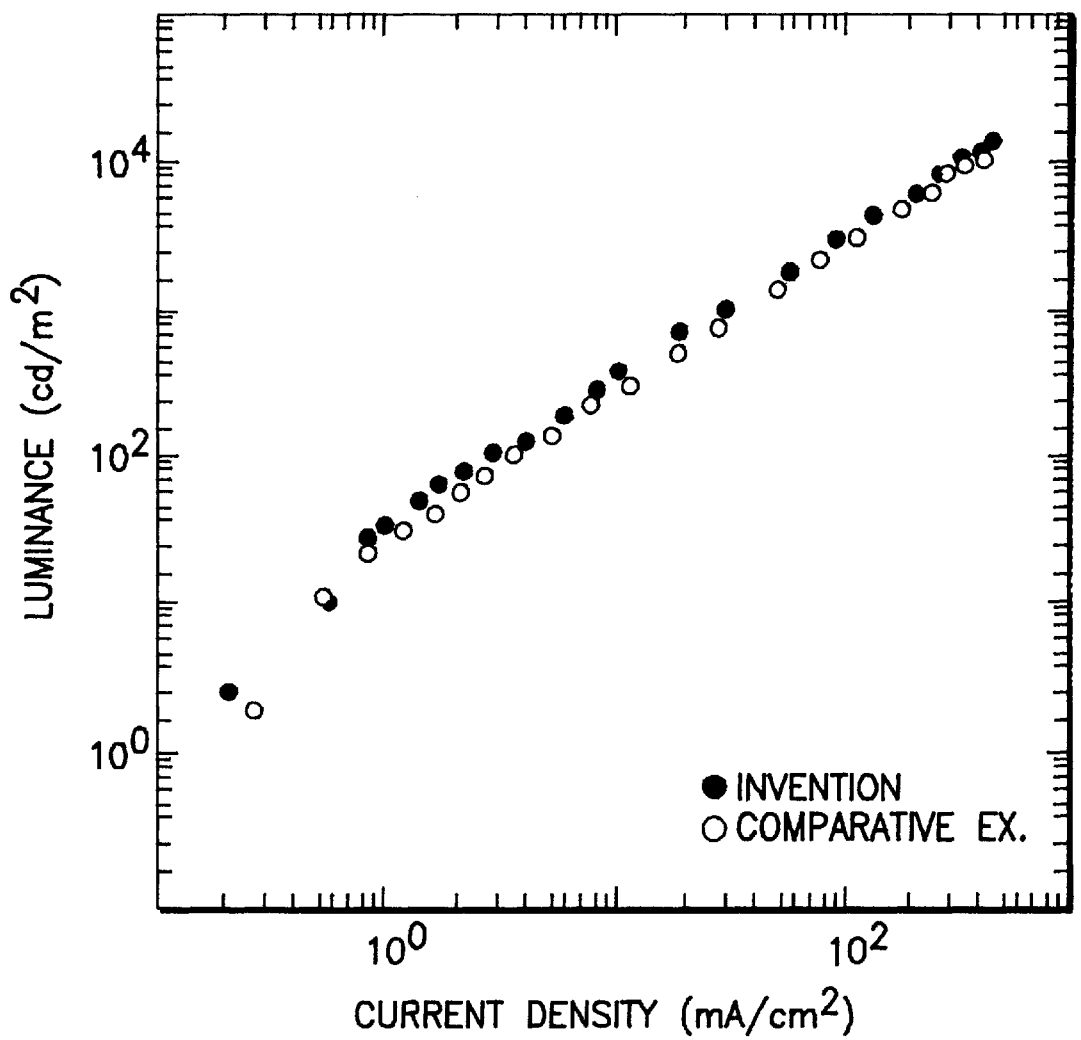
FIG. 5 is a diagram illustrative of the properties of luminance versus a current density of the device in a twenty-first embodiment and a second comparative example.
Figure 6:
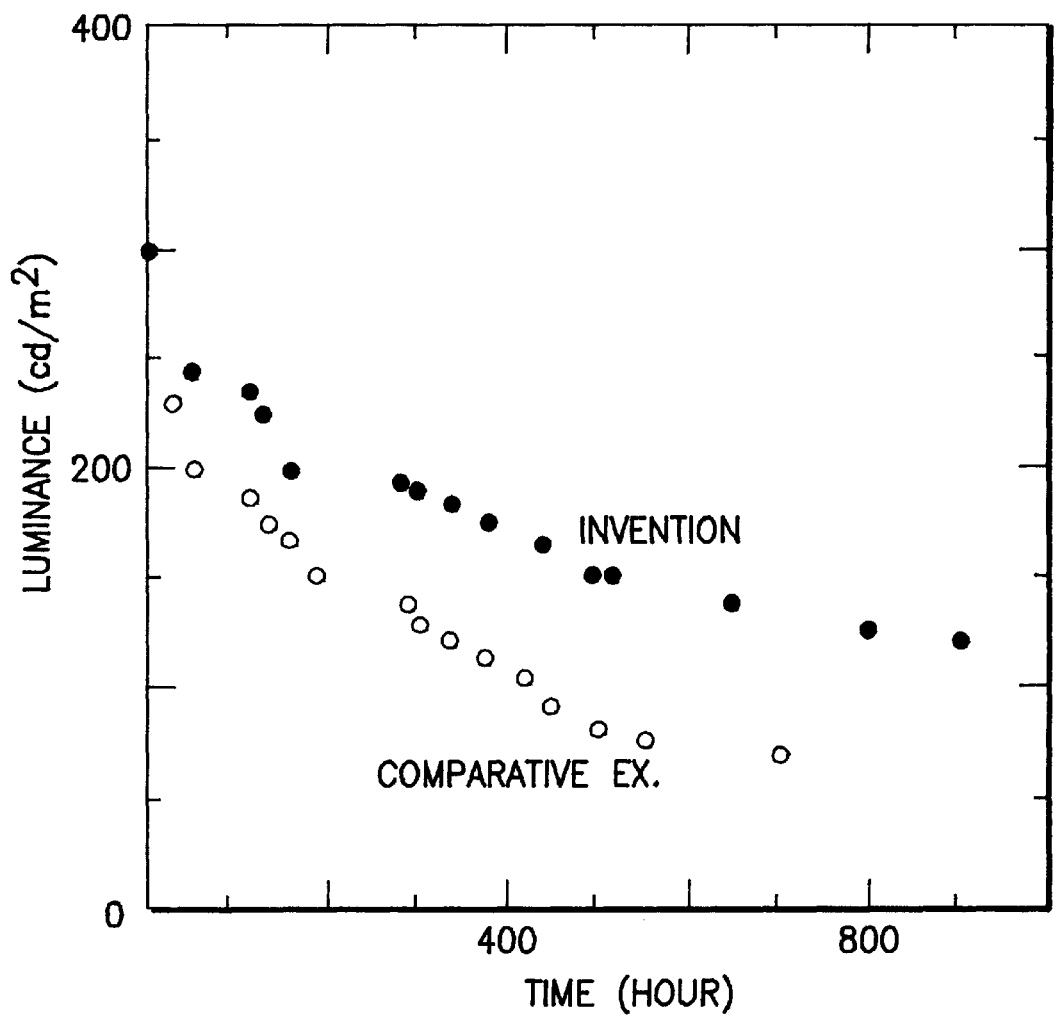
FIG. 6 is a diagram illustrative of the properties of durability versus a current density of the device in a twenty-first embodiment and a second comparative example.

A twenty first embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 2, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.96 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 510 hours at a condition of an initial luminance of 300 cd/m$^2$. This result means that the improved hole transport layer improves the durability.

A twenty second embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 9, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.98 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 500 hours at a condition of an initial luminance of 300 cd/m$^2$. This result means that the improved hole transport layer improves the durability.

A twenty third embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 16, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.00 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 445 hours at a condition of an initial luminance of 300 cd/m$^2$. This result means that the improved hole transport layer improves the durability.

A twenty fourth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 27, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.14 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 430 hours at a condition of an initial luminance of 300 $cd/m^2$. This result means that the improved hole transport layer improves the durability.

A twenty fifth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 35, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.99 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 460 hours at a condition of an initial luminance of 300 $cd/m^2$. This result means that the improved hole transport layer improves the durability.

A twenty sixth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 52, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.20 $mA/cm^2$ is necessary for enabling the device to exhibit a luminance of 100 $cd/m^2$. This result means that the improved hole transport layer improves the efficiency of luminance of the device. It was also confirmed that a half-value period of luminance is 380 hours at a condition of an initial luminance of 300 $cd/m^2$. This result means that the improved hole transport layer improves the durability.

A twenty seventh embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 62, mentioned on the Table, is formed on the hole injection layer by the molecular beam epitaxy method under a vacuum pressure of $5.810^{-9}$ Torr so that thickness of sport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.15 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 415 hours at a condition of an initial luminance of 300 cd/m$^2$. This result means that the improved hole transport layer improves the durability.

A twenty eighth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 70, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.25 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 395 hours at a condition of an initial luminance of 300 cd/m$^2$. This result means that the improved hole transport layer improves the durability.

A twenty ninth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 82, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.08 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 355 hours at a condition of an initial luminance of 300 cd/m$^2$. This result means that the improved hole transport layer improves the durability.

A thirtieth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 92, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.84 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 465 hours at a condition of an initial luminance of 300 cd/m$^2$. This result means that the improved hole transport layer improves the durability.

A thirty first embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 97, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.12 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 385 hours at a condition of an initial luminance of 300 cd/m$^2$. This result means that the improved hole transport layer improves the durability.

A thirty second embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 105, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.15 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 320 hours at a condition of an initial luminance of 300 cd/m$^2$. This result means that the improved hole transport layer improves the durability.

A thirty third embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 112, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.23 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 365 hours at a condition of an initial luminance of 300 cd/m$^2$. This result means that the improved hole transport layer improves the durability.

A thirty fourth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 118, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.90 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 435 hours at a condition of an initial luminance of 300 cd/m$^2$. This result means that the improved hole transport layer improves the durability.

A thirty fifth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 122, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.26 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 305 hours at a condition of an initial luminance of 300 cd/m$^2$. This result means that the improved hole transport layer improves the durability.

A thirty sixth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of 210$^{-8}$ Torr so that the hole transport layer has a thickness of 5 nanometers. A hole transport layer, made of the compound 128, mentioned on the Table, is formed on the hole injection layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of 910$^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.15 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 435 hours at a condition of an initial luminance of 300 cd/m$^2$. This result means that the improved hole transport layer improves the durability.

A thirty seventh embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of 210$^{-8}$ Torr so that the hole transport layer has a thickness of 5 nanometers. A hole transport layer, made of the compound 138, mentioned on the Table, is formed on the hole injection layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of 910$^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.95 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 450 hours at a condition of an initial luminance of 300 cd/m$^2$. This result means that the improved hole transport layer improves the durability.

A thirty eighth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of 210$^{-8}$ Torr so that the hole transport layer has a thickness of 5 nanometers. A hole transport layer, made of the compound 144, mentioned on the Table, is formed on the hole injection layer by the molecular beam epitaxy method under a vacuum pressure of 5.810$^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of 6.510$^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 2.90 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 465 hours at a condition of an initial luminance of 300 cd/m$^2$. This result means that the improved hole transport layer improves the durability.

A thirty ninth embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 146, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.25 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 385 hours at a condition of an initial luminance of 300 cd/m$^2$. This result means that the improved hole transport layer improves the durability.

A forties embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 151, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.08 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 410 hours at a condition of an initial luminance of 300 cd/m$^2$. This result means that the improved hole transport layer improves the durability.

A forty first embodiment according to the present invention will be described with reference to FIG. 2. The organic thin film electroluminescent device in this embodiment comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of the compound 154, mentioned on the Table, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An aluminum alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.15 mA/cm$^2$ is necessary for enabling the device to exhibit a luminance of 100 cd/m$^2$. This result means that the improved hole transport layer improves the efficiency of luminance of the device. It was also confirmed that a half-value period of luminance is 390 hours at a condition of an initial luminance of 300 cd/m$^2$. This result means that the improved hole transport layer improves the durability.

(Comparative Example 2)

A comparative example 2 will be described. The organic thin film electroluminescent device in this comparative example comprises an anode, a hole injection layer, a hole transport layer, a potential barrier layer, a light emission layer and a cathode. The organic thin film electroluminescent device may be fabricated by the following processes. An indium-tin-oxide layer is formed on a glass substrate by sputtering so that the indium-tin-oxide layer has a sheet resistance of 20/thereby the anode comprising the indium-tin-oxide layer is formed on the glass substrate. A hole injection layer, made of titanium-phthalocyanine-oxide, is formed on the anode layer by the molecular beam epitaxy method under a vacuum pressure of $210^{-8}$ Torr so that the hole transport layer has a thickness of 5 nanometers. A hole transport layer, made of 1,1-bis-(4-di-para-triaminophenyl) cyclohexane, is formed on the hole injection layer by the molecular beam epitaxy method under a vacuum pressure of $5.810^{-9}$ Torr so that the hole transport layer has a thickness of 30 nanometers. A potential barrier layer, comprising N,N'-diphenyl-N,N'-bis(3-methylphenyl)-[1,1'-biphenyl]-4,4'-diamine, is formed on the hole transport layer by the molecular beam epitaxy method under a vacuum pressure of $6.510^{-9}$ Torr so that the potential barrier layer has a thickness of 5 nanometers. A light emission layer, comprising tris(8-hydroxyquinolinate aluminum), is formed on the potential barrier layer by the molecular beam epitaxy method under a vacuum pressure of $910^{-9}$ Torr so that the light emission layer has a thickness of 75 nanometers. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas.

Luminance properties of the above organic thin film electroluminescent device were measured in a dry atmosphere. It was confirmed that a current density of 3.68 mA/cm$^2$ is necessary for enabling the device to exhibit a luminance of 100 cd/m$^2$. It was also confirmed that a half-value period of luminance is 188 hours at a condition of an initial luminance of 300 cd/m$^2$. This result means that the above hole transport layer reduces the durability.

(EXAMPLE 42)

Figure 7:
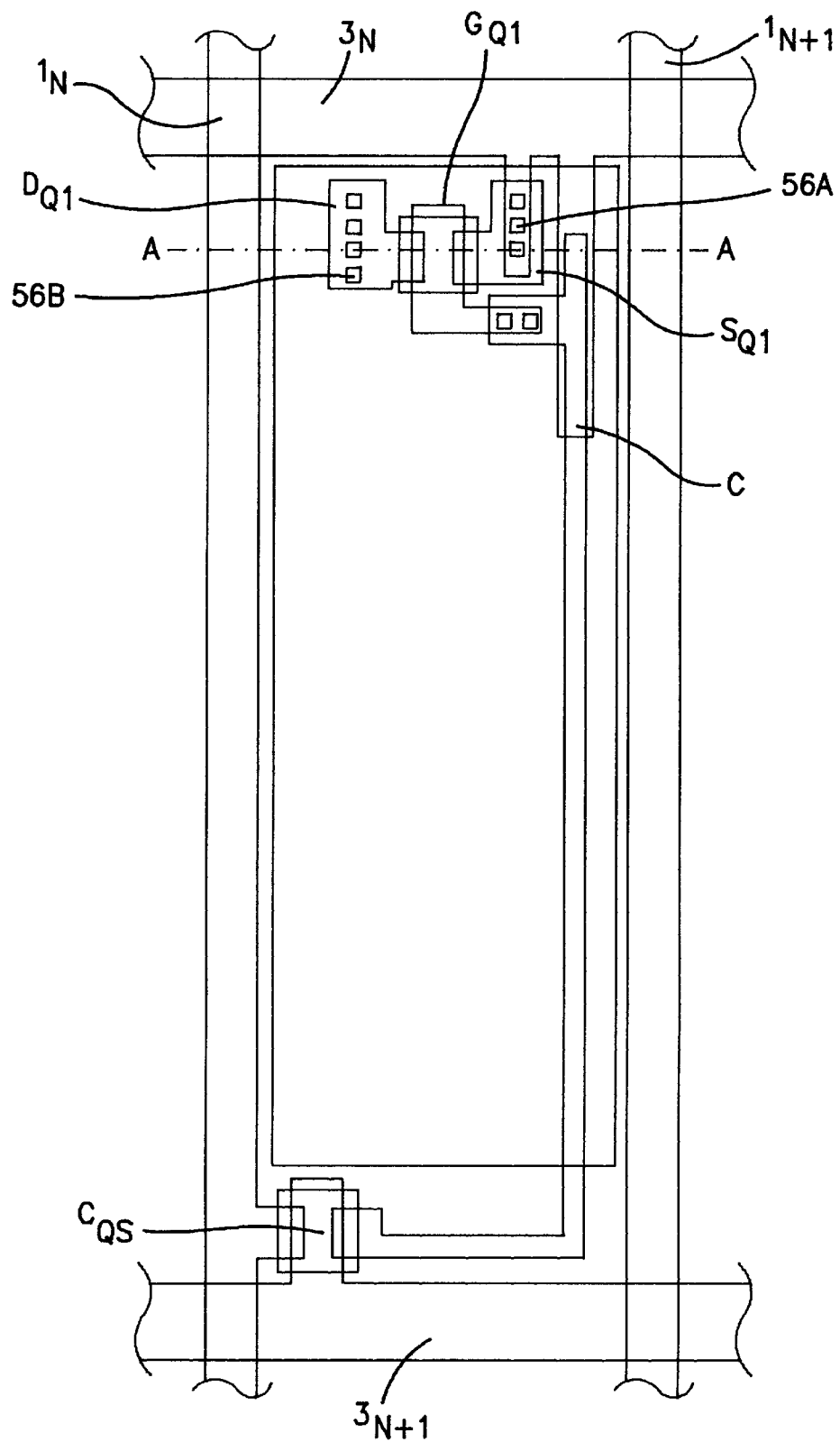
FIG. 7 is a fragmentary plane view illustrative of pixels of a novel matrix type organic thin film electroluminescent device in a forty-second embodiment according to the present invention.
Figure 8:
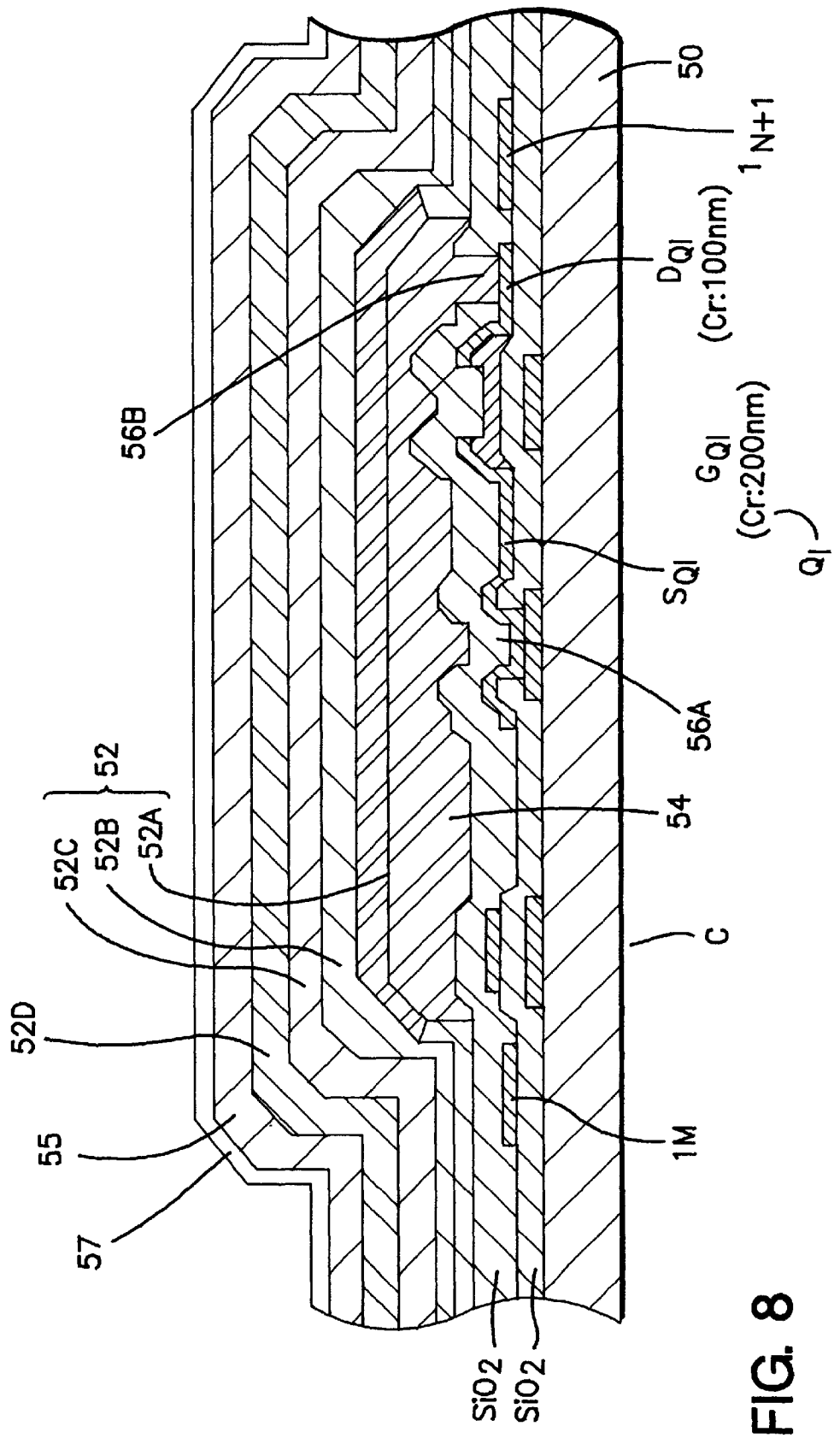
FIG. 8 is a fragmentary cross sectional elevation view, taken along A—A line of FIG. 7, illustrative of pixels of a novel matrix type organic thin film electroluminescent device in a forty-second embodiment according to the present invention.

A forty second embodiment according to the present invention will be described with reference to FIGS. 7 and 8. There is provided a matrix type organic thin film electroluminescent device. FIGS. 7 and 8 illustrate driving circuits with thin film transistors for driving the matrix type organic thin film electroluminescent device.

A Cr layer having a thickness of 200 nanometers is grown on a glass substrate. Scanning electrode lines $3_N$ and $3_{N+1}$, one of a capacitor C, a gate electrode Gqs of a switching transistor, and a gate electrode Gq1 of a current control transistor are formed by patterning. A gate oxide film of SiO$_2$, having a thickness of 400 nanometers, is grown. Thereafter, a first contact hole 56A is formed.

An intrinsic amorphous silicon layer, having a thickness of 300 nanometers, is grown on the SiO$_2$ film. An n-doped amorphous silicon layer, having a thickness of 50 nanometers is grown on the intrinsic amorphous silicon layer. Both the layers are then patterned to form an island on the SiO$_2$ film.

A Cr layer, having a thickness of 100 nanometers, is deposited and then patterned to form signal lines 1M, source/drain electrodes $S_{Q1}$ and $S_{Q2}$ of the current control transistor Q1, source/drain electrodes of the switching transistor and another electrode of the capacitor C. The intrinsic amorphous silicon layer and the n-doped amorphous silicon layer are etched by using the Cr layer, for the source/drain electrodes, as masks to form a channel region.

A SiO$_2$ film, having a thickness of 200 nanometers is grown and then a second contact hole 56b is formed by etching the SiO$_2$ film.

An indium-tin-oxide film, having a thickness of 150 nanometers, is formed by sputtering and then patterned by a rift off method to form an anode. As a result, a display panel of 400640 pixels is formed. Each pixel has a size of 100 micrometers 300 micrometers.

A organic thin film electroluminescent device 52 is formed on the display panel. The organic thin film electroluminescent device 52 comprises an anode, a hole injection layer 52A, a hole transport layer 52b, a potential barrier layer 52C, a light emission layer 52D and a cathode. The hole injection layer 52A is made of titanium-phthalocyanine-oxide. The hole injection layer 52A, having a thickness of 20 nanometers, is formed by the molecular beam epitaxy method. The hole transport layer is formed by dipping method. Materials of the hole transport layer is prepared as follows. The compound 2, mentioned on Table, is dissolved in dicrolomethane so that the compound 2 and poly-(N-vinylcarbazole) are 1:1 by weight to form a dicrolomethane solution containing 1% of the compound 2. A dip coater is used to form the hole transport layer having a thickness of 55 nanometers. The potential barrier layer, having a thickness of 10 nanometers and being made of N,N'-diphenyl-N,N'-bis(3-methylphenyl)-[1,1'-biphenyl]-4, 4'-diamine, is formed by the molecular beam epitaxy under a vacuum pressure of $6.510^{-9}$ . A coevapolation method is carried out where tris(8-hydroxyquinolinate aluminum) and 3,9-prylenedicarboxylic acid diphenyl-ester are supplied from different sources so as to form the light emission layer, having a thickness of 90 nanometers, including 1.4 mole % of 3,9-prylenedicarboxylic acid diphenyl-ester. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas. As a result, there is formed the matrix type organic electroluminescent device to be driven by the driving circuits having the thin film transistors.

Figure 9:
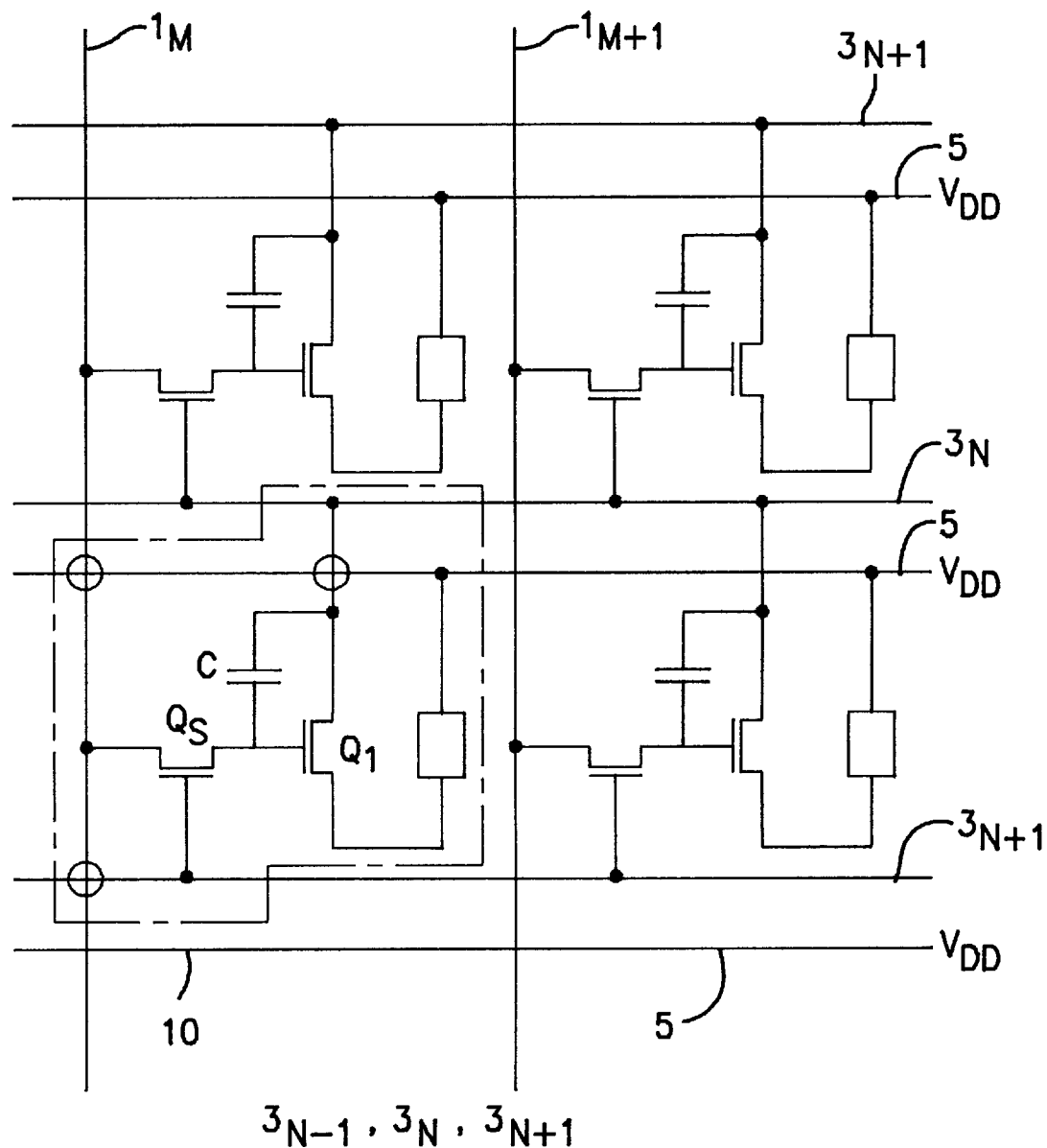
FIG. 9 is a circuit diagram of a driving circuit which drives a novel matrix type organic thin film electroluminescent device in a forty-second embodiment according to the present invention.

Operations of the matrix type organic electroluminescent device will be described with reference to FIG. 9. When the scanning electrode line $3_{N+1}$ is selected and then the switching transistor Qs turns ON, a voltage on the signal electrode line $1_M$ is supplied via the switching transistor Qs to the capacitor C. When the scanning electrode line $3_{N+1}$ is not selected and then the switching transistor Qs turns OFF, the voltage of the capacitor C is kept. This voltage on the capacitor is applied onto between the gate and source of the current control transistor Q1. As a result, the current flows through the power source electrode 5, the organic thin film electroluminescent device, the transistor Q1 to the scanning electrode line $3_N$ thereby the organic thin film electroluminescent device exhibits light emissions. When the organic thin film electroluminescent device is driven at a voltage of 8.5V, the device exhibits a luminance of around 380 cd/m².

The organic thin film electroluminescent device is subjected to the durability test thereby it is confirmed that the half-value period is 460 hours at the initial luminance of 100 cd/m². At an initial time, there is 10% of non-luminance area. After 460 hours, there is 20% of the non-luminance area.

(Comparative example 3)

A comparative example 3 will be described. A organic thin film electroluminescent device is formed on the display panel. The organic thin film electroluminescent device comprises an anode, a hole injection layer, a hole transport layer, a potential barrier layer, a light emission layer and a cathode. The hole injection layer is made of titanium-phthalocyanine-oxide. The hole transport layer is formed by dipping method. Materials of the hole transport layer is prepared as follows. 1,1-bis-(4-di-para-trylaminophenyl)cyclohexane is used in place of the compound 2. 1,1-bis-(4-di-para-trylaminophenyl)cyclohexane and poly-(N-vinylcarbazole) are 1:1 by weight to form a dicrolomethane solution containing 1% of 1,1-bis-(4-di-para-trylamino-phenyl)cyclohexane. A dip coater is used to form the hole transport layer having a thickness of 55 nanometers. The potential barrier layer, having a thickness of 10 nanometers and being made of N,N'-diphenyl-N,N'-bis(3-methylphenyl)-[1,1'-biphenyl]-4,4'-diamine, is formed by the molecular beam epitaxy under a vacuum pressure of $6.510^{-9}$. A coevapolation method is carried out where tris(8-hydroxyquinolinate aluminum) and 3,9-prylenedicarboxylic acid diphenyl-ester are supplied from different sources so as to form the light emission layer, having a thickness of 90 nanometers, including 1.4 mole % of 3,9-prylenedicarboxylic acid diphenyl-ester. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas. As a result, there is formed the matrix type organic electroluminescent device to be driven by the driving circuits having the thin film transistors.

When the organic thin film electroluminescent device is driven at a voltage of 8.5V, the device exhibits a luminance of around 290 cd/m². The organic thin film electroluminescent device is subjected to the durability test thereby it is confirmed that the half-value period is 280 hours at the initial luminance of 100 cd/m². At an initial time, there is 15% of non-luminance area. After 280 hours, there is 35% of the non-luminance area.

(EXAMPLE 43)

A forty third embodiment according to the present invention will be described. A organic thin film electroluminescent device is formed on the display panel. The organic thin film electroluminescent device comprises an anode, a hole injection layer, a hole transport layer, a potential barrier layer, a light emission layer and a cathode. An indium-tin-oxide layer is formed on a glass substrate by sputtering so that the indium-tin-oxide has a sheet resistance of 20 thereby the anode is formed. The hole injection layer is made of quinacridon. The hole transport layer is formed by dipping method. Materials of the hole transport layer is prepared as follows. The compound 2 is dissolved in dichrolomethane so that the compound 2 and poly-(N-vinylcarbazole) are 1:1 by weight to form a dicrolomethane solution containing 1% of the compound 2. A dip coater is used to form the hole transport layer having a thickness of 55 nanometers. The potential barrier layer, having a thickness of 10 nanometers and being made of 1,1'-bis(4-di-para-trylaminophenyl)cyclohexane, is formed by the molecular beam epitaxy under a vacuum pressure of $5.810^{-9}$. A light emission layer, made of tris(8-hydroxyquinolinate aluminum), and having a thickness of 75 nanometers, is formed by the molecular beam epitaxy under a vacuum pressure of $910^{-9}$. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas. As a result, there is formed the matrix type organic electroluminescent device to be driven by the driving circuits having the thin film transistors.

A current density of 2.94 mA/cm² is necessary for enabling the device to exhibit 100 cd/m². The organic thin film electroluminescent device is subjected to the durability test thereby it is confirmed that the half-value period is 580 hours at the initial luminance of 300 cd/m².

(Comparative Examples 4, 5)

A comparative example 4 will be described. A organic thin film electroluminescent device is formed on the display panel. The organic thin film electroluminescent device comprises an anode, a hole injection layer, a hole transport layer, a potential barrier layer, a light emission layer and a cathode. An indium-tin-oxide layer is formed on a glass substrate by sputtering so that the indium-tin-oxide has a sheet resistance of 20 thereby the anode is formed. The hole injection layer is made of quinacridon. The hole transport layer is formed by dipping method. Materials of the hole transport layer is prepared as follows. 1,1-bis-(4-di-para-trilaminophenyl) cyclohexane dissolved in dichrolomethane so that 1,1-bis (4-di-para-trilaminophenyl)cyclohexane dissolved in dichrolomethane and poly-(N-vinylcarbazole) are 1:1 by weight to form a dicrolomethane solution containing 1% of the compound 2. A dip coater is used to form the hole transport layer having a thickness of 55 nanometers. The potential barrier layer, having a thickness of 10 nanometers and being made of 1,1'-bis(4-di-para-trylaminophenyl) cyclohexane, is formed by the molecular beam epitaxy under a vacuum pressure of $5.810^{-9}$. A light emission layer, made of tris(8-hydroxyquinolinate aluminum), and having a thickness of 75 nanometers, is formed by the molecular beam epitaxy under a vacuum pressure of $910^{-9}$. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas. As a result, there is formed the matrix type organic electroluminescent device to be driven by the driving circuits having the thin film transistors.

A current density of 3.15 mA/cm$^2$ is necessary for enabling the device to exhibit 100 cd/m$^2$. The organic thin film electroluminescent device is subjected to the durability test thereby it is confirmed that the half-value period is 340 hours at the initial luminance of 300 cd/m$^2$.

A comparative example 5 will be described. A organic thin film electroluminescent device is formed on the display panel. The organic thin film electroluminescent device comprises an anode, a hole transport layer, a potential barrier layer, a light emission layer and a cathode. An indium-tin-oxide layer is formed on a glass substrate by sputtering so that the indium-tin-oxide has a sheet resistance of 20 thereby the anode is formed. The hole transport layer, made of the compound 2, mentioned on Table, and having a thickness of 30 nanometers, is formed by the molecular beam epitaxy method under a vacuum pressure of $5.8\ 10^{-9}$ Torr. The potential barrier layer, having a thickness of 10 nanometers and being made of 1,1'-bis(4-di-para-trylaminophenyl) cyclohexane, is formed by the molecular beam epitaxy under a vacuum pressure of 5.8. A light emission layer, made of tris(8-hydroxyquinolinate aluminum), and having a thickness of 75 nanometers, is formed by the molecular beam epitaxy under a vacuum pressure of $910^{-9}$ Torr. An alumnium alloy containing 1 mole % of scandium is subjected to RF sputtering in argon gas, and lithium is evaporated from a resistive heat source so that the cathode layer containing 0.3 mole % of lithium is formed on the light emission layer. The cathode layer has a thickness of 20 nanometers. A protective layer, having a thickness of 300 nanometers, is formed on the cathode by the RF sputtering of an alumnium alloy containing 1 mole % of scandium in argon gas. As a result, there is formed the matrix type organic electroluminescent device to be driven by the driving circuits having the thin film transistors.

A current density of 5.63 mA/cm$^2$ is necessary for enabling the device to exhibit 100 cd/m$^2$. The organic thin film electroluminescent device is subjected to the durability test thereby it is confirmed that the half-value period is 170 hours at the initial luminance of 300 cd/m$^2$.

Whereas modifications of the present invention will be apparent to a person having ordinary skill in the art, to which the invention pertains, it is no doubt be understood that embodiments shown and described by way of illustrations are by no means intended to be considered in a limiting sense. Accordingly, it is to be intended to cover by claims all modifications which fall within the sprite and scope of the invention.

What is claimed is:

1. An organic thin film electroluminescent device comprising:
    an anode;
    a hole transport layer in contact with said anode, the hole transport layer having a first energy band gap;
    a potential barrier layer in contact with the hole transport layer, said potential barrier layer having a second energy band gap which is larger than said first energy band gap;
    a light emission layer in contact with said potential barrier layer, said light emission layer having a third energy band gap which is smaller than said second energy band gap; and
    a cathode in contact with said light emission layer, wherein the hole transport layer is made of a material containing at least a ditriphenylaminestyryl derivative expressed by the following formula:

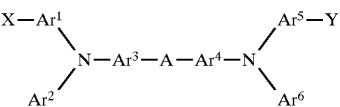

where A is one selected from the group consisting of substituted alkylidene groups having not less than 10 carbon atoms, non-substituted alkylidene groups having not less than 10 carbon atoms, cycloalkylidene groups, oxygen atom, sulfur atom, substituted amino groups and non-substituted amino groups; where Ar$^1$, Ar$^3$, Ar$^4$ and Ar$^5$ are one selected from the group consisting of substituted arylene groups and non-substituted arylene groups; where Ar$^2$ and Ar$^6$ are one selected from the group consisting of substituted aryl groups and non-substituted aryl groups; and where X and Y are substituted groups expressed by the formula:

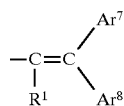

where Ar$^7$ and Ar$^8$ are one selected from the group consisting of substituted aryl groups and non-substituted aryl groups; and where R$^1$ is one selected from the group consisting of hydrogen atom, halogen atom, hydroxyl groups, substituted amino groups, non-substituted amino groups, substituted alkoxy groups, non-substituted alkoxy groups, substituted alkyl groups having 1–6 carbon atoms, and non-substituted alkyl groups having 1–6 carbon atoms.

2. The device as claimed in claim 1, wherein said aryl groups of Ar$^7$ and Ar$^8$ comprise phenyl groups.

3. The device as claimed in claim 1, wherein said aryl groups of Ar$^7$ and Ar$^8$ comprise naphthyl groups.

4. The device as claimed in claim 1, wherein said amino groups of R$^1$ comprise dimethylamino groups.

5. The device as claimed in claim 1, wherein said amino groups of R$^1$ comprise diethylamino groups.

6. The device as claimed in claim 1, wherein said amino groups of R$^1$ comprise diphenylamino groups.

7. The device as claimed in claim 1, wherein said alkoxy groups of R$^1$ comprise methoxy groups.

8. The device as claimed in claim 1, wherein said alkoxy groups of $R^1$ comprise ethoxy groups.

9. The device as claimed in claim 1, wherein said alkoxy groups of $R^1$ comprise propoxy groups.

10. The device as claimed in claim 1, wherein said alkoxy groups of $R^1$ comprise butoxy groups.

11. The device as claimed in claim 1, wherein said alkyl groups of $R^1$ comprise methyl groups.

12. The device as claimed in claim 1, wherein said alkyl groups of $R^1$ comprise ethyl groups.

13. The device as claimed in claim 1, wherein said alkyl groups of $R^1$ comprise propyl groups.

14. The device as claimed in claim 1, wherein said alkyl groups of $R^1$ comprise butyl groups.

15. The device as claimed in claim 1, wherein said halogen atom of $R^1$ comprises one selected from the group consisting of fluorine atom, chlorine atom, bromine atom and iodine atom.

16. The device as claimed in claim 1, wherein said cycloalkylidene groups of A comprise cyclohexylidene groups.

17. The device as claimed in claim 1, wherein said cycloalkylidene groups of A comprise 4-tert-butylcyclohexylidene groups.

18. The device as claimed in claim 1, wherein said amino groups of A comprise methylamino groups.

19. The device as claimed in claim 1, wherein said amino groups of A comprise ethylamino groups.

20. The device as claimed in claim 1, wherein said amino groups of A comprise phenylamino groups.

21. The device as claimed in claim 1, wherein said aryl and arylene groups of $Ar^1$, $Ar^2$, $Ar^3$, $Ar^4$, $Ar^5$ and $Ar^6$ comprise any one of phenyl, naphthyl, anthnyl, phenylene, naphtbylene and anthylene.

22. The device as claimed in claim 1, wherein said material further includes a triphenyldiamine compound.

23. The device as claimed in claim 1, wherein said material further includes an oxadiazole compound.

24. The device as claimed in claim 1, wherein said material further includes a porphyrin compound.

25. The device as claimed in claim 1, wherein said material further includes a stilbene compound.

26. The device as claimed in claim 1, wherein said material further includes an anylamine compound.

27. The device as claimed in claim 1, wherein said material is dispersed in poly-(N-vinylcarbazole).

28. The device as claimed in claim 1, wherein said material is dispersed in polycarbonate.

29. The device as claimed in claim 1, wherein said material is dispersed in polymethylacrylate.

30. The device as claimed in claim 1, wherein said material is dispersed in polymethylmethacrylate.

31. The device as claimed in claim 1, wherein said material is dispersed in polystyrene polymer.

32. The device as claimed in claim 1, wherein said material is dispersed in polysilylene polymer.

33. The device as claimed in claim 1, wherein said material is dispersed in polythiophene polymer.

34. The device as claimed in claim 1, wherein said material is dispersed in polyaniline.

35. The device as claimed in claim 1, wherein said material is dispersed in polyphenylenevinylene.

36. The device as claimed in claim 1, wherein said potential barrier layer has a thickness of not more than 10 nanometers.

37. A device as claimed in claim 1, wherein said potential barrier layer comprises one selected from the group consisting of triphenyldiamine compounds, oxadiazole compounds, hydrazone compounds, butadiene compounds, styryl compounds, pyrazoline compounds and benzidine compounds.

38. The device as claimed in claim 1, wherein said light emission layer comprises one selected from the group consisting of 8-quinolinol, metal complexes of 8-quinolinol compounds, tetraphenylbutadiene compounds, distyrylallyl compounds, coumarin system compounds, quinacridone compounds, perylene system compounds, polymethine system compounds, anthracene compounds, and polyvinylcarbazole.

39. The device as claimed in claim 1, further comprising a hole injection layer between said anode and the hole transport layer.

40. The device as claimed in claim 39, wherein the hole injection layer has a thickness of not more than 30 nanometers.

41. The device as claimed in claim 39, wherein said hole injection layer comprises a coloring matter of condensed multiring system.

42. The device as claimed in claim 41, wherein said coloring matter comprises one selected from the group consisting of spiro compounds, azo compounds, quinone compounds, indigo compounds, diphenylmethane compounds, quinacridone compounds, polymethyl compounds, acridine compounds, and porphyrine compounds.

43. The device as claimed in claim 39, wherein said hole injection layer comprises aromatic amine.

44. The device as claimed in claim 1, further comprising an electron injection layer between said cathode and said light emission layer.

45. The device as claimed in claim 44, wherein said electron injection layer comprises one selected from the group consisting of 8-quinolinol, 8-quinolinol compounds, oxydiazole compounds and diphenylquinone compounds.

46. The device as claimed in claim 1, wherein said anode comprises a metal having a work function of not less than 4.5 eV.

47. The device as claimed in claim 46, wherein said anode comprises one selected from the group consisting of indium-tin-oxide, tin oxide, gold, silver, platinum and copper.

48. The device as claimed in claim 1, wherein said cathode comprises one selected from the group consisting of indium, aluminum, magnesium, magnesium-indium alloy, magnesium-aluminum alloy, aluminum-lithium alloy, and aluminum-scandium-lithium alloy.

* * * * *